(12) United States Patent
Lee et al.

(10) Patent No.: US 12,199,137 B2
(45) Date of Patent: Jan. 14, 2025

(54) INTEGRATED CIRCUIT DEVICES AND METHODS OF MANUFACTURING THE SAME

(71) Applicant: Samsung Electronics Co., Ltd., Suwon-si (KR)

(72) Inventors: Jinho Lee, Hwaseong-si (KR); Younsoo Kim, Yongin-si (KR); Haeryong Kim, Seongnam-si (KR); Sunghyun Kim, Pyeongtaek-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 191 days.

(21) Appl. No.: 17/583,790

(22) Filed: Jan. 25, 2022

(65) Prior Publication Data

US 2022/0416010 A1    Dec. 29, 2022

(30) Foreign Application Priority Data

Jun. 24, 2021    (KR) .................. 10-2021-0082331

(51) Int. Cl.
*H01L 21/00* (2006.01)
*H01L 49/02* (2006.01)
*H10B 12/00* (2023.01)

(52) U.S. Cl.
CPC ............ *H01L 28/60* (2013.01); *H10B 12/033* (2023.02); *H10B 12/31* (2023.02)

(58) Field of Classification Search
CPC ................................. H01L 28/60; H10B 12/31
See application file for complete search history.

(56) References Cited

U.S. PATENT DOCUMENTS

| | | |
|---|---|---|
| 6,372,598 B2 | 4/2002 | Kang et al. |
| 6,475,854 B2 | 11/2002 | Narwankar et al. |

(Continued)

FOREIGN PATENT DOCUMENTS

| | | |
|---|---|---|
| KR | 100447972 B1 | 9/2004 |
| KR | 101583516 B1 | 1/2016 |

(Continued)

OTHER PUBLICATIONS

"Third Office Action", TW Application No. 111117490, Oct. 30, 2023, 5 pp.

(Continued)

*Primary Examiner* — Richard A Booth
(74) *Attorney, Agent, or Firm* — Myers Bigel, P.A.

(57) ABSTRACT

An integrated circuit (IC) device includes a lower electrode including a first metal, a dielectric film on the lower electrode, and a conductive interface layer between the lower electrode and the dielectric film. The conductive interface layer includes a metal oxide film including at least one metal element. An upper electrode including a second metal is opposite the lower electrode, with the conductive interface layer and the dielectric film therebetween. To manufacture an IC device, an electrode including a metal is formed adjacent to an insulating pattern on a substrate. A conductive interface layer including a metal oxide film including at least one metal element is selectively formed on a surface of the electrode. A dielectric film is formed to be in contact with the conductive interface layer and the insulating pattern.

18 Claims, 26 Drawing Sheets

(56) References Cited

U.S. PATENT DOCUMENTS

| | | | |
|---|---|---|---|
| 6,617,206 B1* | 9/2003 | Sandhu | H01L 28/91 |
| | | | 438/770 |
| 7,071,071 B2 | 7/2006 | Iijima et al. | |
| 8,518,793 B2 | 8/2013 | Kim et al. | |
| 8,580,648 B2 | 11/2013 | Choi et al. | |
| 8,901,711 B1 | 12/2014 | Yang et al. | |
| 9,780,121 B2 | 10/2017 | Watanabe et al. | |
| 10,164,003 B2* | 12/2018 | Lin | H01L 28/60 |
| 2008/0160712 A1* | 7/2008 | Park | H01L 28/56 |
| | | | 361/313 |
| 2011/0136317 A1 | 6/2011 | Kang et al. | |
| 2018/0233350 A1 | 8/2018 | Tois et al. | |
| 2019/0355804 A1 | 11/2019 | Park et al. | |
| 2020/0219880 A1 | 7/2020 | Kim et al. | |
| 2020/0395436 A1* | 12/2020 | Jung | H10B 12/315 |
| 2020/0395438 A1 | 12/2020 | Kang et al. | |
| 2021/0384194 A1 | 12/2021 | Woo et al. | |
| 2022/0037325 A1 | 2/2022 | Kang et al. | |

FOREIGN PATENT DOCUMENTS

| | | |
|---|---|---|
| KR | 20210150214 A | 12/2021 |
| TW | 201725737 A | 7/2017 |
| TW | I667604 B | 8/2019 |
| TW | 202205629 A | 2/2022 |

OTHER PUBLICATIONS

Examination Report issued for corresponding Indian Application No. 202244031466 (Sep. 27, 2024).

* cited by examiner

INTEGRATED CIRCUIT DEVICES AND METHODS OF MANUFACTURING THE SAME

CROSS-REFERENCE TO RELATED APPLICATION

This application is based on and claims priority under 35 U.S.C. § 119 to Korean Patent Application No. 10-2021-0082331, filed on Jun. 24, 2021, in the Korean Intellectual Property Office, the disclosure of which is incorporated by reference herein in its entirety.

BACKGROUND

The present disclosure relates to integrated circuit (IC) devices and methods of manufacturing the same. Due to the development of electronics technology, the downscaling of semiconductor devices has rapidly progressed, and thus, patterns included in electronic devices have been miniaturized. Accordingly, it may be beneficial to develop a structure capable of reducing a leakage current of a capacitor having a miniaturized size and maintaining desired electrical characteristics.

SUMMARY

The inventive concept provides an integrated circuit (IC) device, which may have a structure capable of reducing a leakage current of a capacitor and maintaining desired electrical characteristics.

The inventive concept also provides a method of manufacturing an IC device, which may reduce a leakage current of a capacitor and maintain desired electrical characteristics.

According to an aspect of the inventive concept, there is provided an IC device including a lower electrode on a substrate. The lower electrode includes a first metal. A dielectric film is on the lower electrode. A conductive interface layer is between the lower electrode and the dielectric film. The conductive interface layer includes a metal oxide film including at least one metal element. An upper electrode is opposite the lower electrode, with the conductive interface layer and the dielectric film therebetween. The upper electrode includes a second metal.

According to another aspect of the inventive concept, there is provided an IC device including a substrate including an active region. A conductive region is on the active region. A capacitor is on the conductive region. An insulating support pattern supports a portion of the capacitor. The capacitor includes a lower electrode including a first metal. The lower electrode includes a portion in contact with the insulating support pattern. A dielectric film is on the lower electrode and the insulating support pattern. A conductive interface layer is between the lower electrode and the dielectric film. The conductive interface layer includes a metal oxide film including at least one metal element. An upper electrode is opposite the lower electrode, with the conductive interface layer and the dielectric film therebetween. The upper electrode includes a second metal.

According to another aspect of the inventive concept, there is provided an IC device including a substrate including an active region. A plurality of conductive regions are on the active region. An insulating pattern extends in a lateral direction on the plurality of conductive regions. The insulating pattern has a plurality of openings vertically overlapping the plurality of conductive regions. A plurality of lower electrodes pass through the insulating pattern via the plurality of openings. The plurality of lower electrodes are connected to the plurality of conductive regions and each include a first metal. An insulating support pattern extends in the lateral direction at a position spaced apart from the insulating pattern in a vertical direction. The insulating support pattern is in contact with a portion of each of the plurality of lower electrodes to support the plurality of lower electrodes. A dielectric film is on the plurality of lower electrodes, the insulating pattern, and the insulating support pattern. A conductive interface layer is between the plurality of lower electrodes and the dielectric film. The conductive interface layer includes a metal oxide film including at least one metal element. An upper electrode is opposite the plurality of lower electrodes, with the conductive interface layer and the dielectric film therebetween. The upper electrode includes a second metal.

According to another aspect of the inventive concept, there is provided a method of manufacturing an IC device. The method includes forming an insulating pattern on a substrate. An electrode including a metal is formed adjacent to the insulating pattern on the substrate. A conductive interface layer is selectively formed on a surface of the electrode. The conductive interface layer includes a metal oxide film including at least one metal element. A dielectric film is formed to be in contact with the conductive interface layer and the insulating pattern.

According to another aspect of the inventive concept, there is provided a method of manufacturing an IC device. The method includes forming a lower electrode and an insulating support pattern on a substrate. The lower electrode includes a first metal, and the insulating support pattern supports the lower electrode. A conductive interface layer is selectively formed only on a surface of the lower electrode, from among the insulating support pattern and the lower electrode. The conductive interface layer includes a metal oxide film including at least one metal element. The conductive interface layer is densified by supplying a post-processing gas to the conductive interface layer. A dielectric film is formed to be in contact with the conductive interface layer and the insulating support pattern. An upper electrode including a second metal is formed opposite the lower electrode with the conductive interface layer and the dielectric film therebetween.

According to another aspect of the inventive concept, there is provided a method of manufacturing an IC device. The method includes forming a plurality of lower electrodes and an insulating support pattern on a substrate. The plurality of lower electrodes include a first metal, and the insulating support pattern supports the plurality of lower electrodes. A conductive interface layer is selectively formed only on surfaces of the plurality of lower electrodes, from among the insulating support pattern and the plurality of lower electrodes. The conductive interface layer includes a metal oxide film including at least one metal element. A post-processing gas is supplied to the conductive interface layer to densify the conductive interface layer. A dielectric film is formed to be in contact with the conductive interface layer and the insulating support pattern. An upper electrode including a second metal is formed opposite the plurality of lower electrodes with the conductive interface layer and the dielectric film therebetween. The formation of the conductive interface layer includes performing a deposition inhibition treatment on a surface of the insulating support pattern, from among the plurality of lower electrodes and the insulating support pattern, by supplying a first pre-processing gas for selectively inhibiting deposition onto the insulating support pattern and the plurality of lower electrode.

An adsorption layer of the first precursor is selectively formed only on the surfaces of the plurality of lower electrodes, from among the insulating support pattern that has been treated to inhibit deposition and the plurality of lower electrodes, by supplying the first precursor including a first metal element to the insulating support pattern that has been treated to inhibit deposition and the plurality of lower electrodes. A first metal oxide film including the first metal element is formed from the adsorption layer of the first precursor by supplying a first oxidizing gas onto the resultant structure including the adsorption layer of the first precursor a first interface sub-layer in contact with the plurality of lower electrode is formed by repeating the selective forming of the adsorption layer of the first precursor and the forming of the first metal oxide film plural times.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
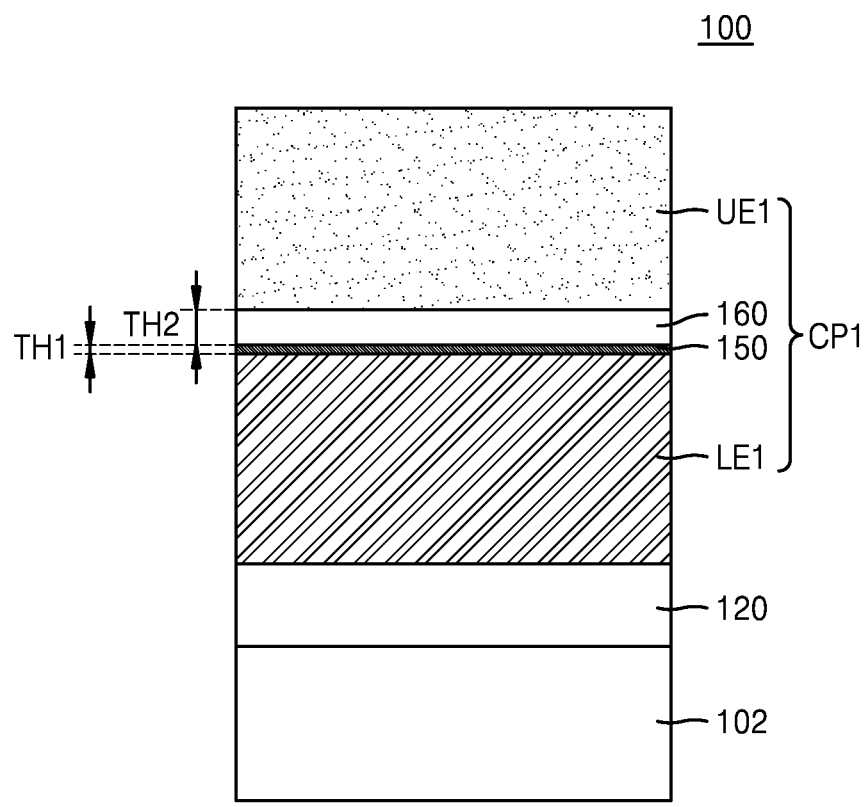
FIG. 1 is a cross-sectional view of main components of an integrated circuit (IC) device according to embodiments.

Hereinafter, embodiments will be described in detail with reference to the accompanying drawings. The same reference numerals are used to denote the same elements in the drawings, and repeated descriptions thereof may be omitted.

As used herein, the abbreviation "Me" refers to a methyl group, "Et" refers to an ethyl group, "Pr" refers to a propyl group, "iPr" refers to an isopropyl group, "tBu" refers to a tert-butyl group (or 1,1-dimethylethyl group), "Cp" refers to cyclopentadienyl, "thd" refers to 2,2,6,6-tetramethyl heptane dionate, and "tAmyl" refers to a tert-amyl group ($CH_3CH_2C(CH_3)_2$—). As used herein, the term "room temperature" refers to a temperature ranging from about 20° C. to about 28° C. and may vary depending on the season.

FIG. 1 is a cross-sectional view of main components of an integrated circuit (IC) device 100 according to embodiments.

Referring to FIG. 1, the IC device 100 may include a substrate 102, a lower structure 120 formed on the substrate 102, and a capacitor CP1 formed on the lower structure 120.

The substrate 102 may include a semiconductor element, such as silicon (Si) and germanium (Ge), or a compound semiconductor, such as silicon carbide (SiC), gallium arsenide (GaAs), indium arsenide (InAs), and indium phosphide (InP). The substrate 102 may include a semiconductor substrate, and structures including at least one insulating film or at least one conductive region, which are formed on the semiconductor substrate. The at least one conductive region may include, for example, a doped well or a doped structure. In example embodiments, the substrate 102 may include various device isolation structures, such as shallow trench isolation (STI) structures.

In example embodiments, the lower structure 120 may include an insulating film. In other example embodiments, the lower structure 120 may include various conductive regions, for example, wiring layers, contact plugs, and transistors, and insulating films that electrically insulate the conductive regions from each other.

The capacitor CP1 may include a lower electrode LE1, a conductive interface layer 150 and a dielectric film 160 sequentially stacked on the lower electrode LE1, and an upper electrode UE1 on (e.g., covering) the dielectric film 160. Accordingly, the conductive interface layer 150 is between the dielectric film 160 and the lower electrode LE1.

The lower electrode LE1 may include a first metal. The upper electrode UE1 may face the lower electrode LE1, with the conductive interface layer 150 and the dielectric film 160 therebetween, and include a second metal. In example embodiments, the second metal may be the same metal as the first metal. In other example embodiments, the second metal may be different from the first metal.

Each of the lower electrode LE1 and the upper electrode UE1 may include a metal film, a conductive metal oxide film, a conductive metal nitride film, a conductive metal oxynitride film, or a combination thereof. In example embodiments, each of the lower electrode LE1 and the upper electrode UE1 may include niobium (Nb), Nb oxide, Nb nitride, Nb oxynitride, titanium (Ti), Ti oxide, Ti nitride, Ti oxynitride, cobalt (Co), Co oxide, Co nitride, Co oxynitride, tin (Sn), Sn oxide, Sn nitride, Sn oxynitride, or a combination thereof. For example, each of the lower electrode LE1 and the upper electrode UE1 may include NbN, TiN, CoN, $SnO_2$, or a combination thereof. In other example embodiments, each of the lower electrode LE1 and the upper electrode UE1 may include TaN, TiAlN, TaAlN, V, VN, Mo, MoN, W, WN, Ru, $RuO_2$, $SrRuO_3$, Ir, $IrO_2$, Pt, PtO, SRO ($SrRuO_3$), BSRO(($Ba,Sr)RuO_3$), CRO($CaRuO_3$), LSCO (($La,Sr)CoO_3$), or a combination thereof. However, a constituent material of each of the lower electrode LE1 and the upper electrode UE1 is not limited thereto.

The conductive interface layer 150 may be between the lower electrode LE1 and the dielectric film 160 and include a metal oxide film including at least one metal element (e.g., at least one kind of metal element). A bottom surface of the conductive interface layer 150 may be in contact with a top surface of the lower electrode LE1, and a top surface of the conductive interface layer 150 may be in contact with a bottom surface of the dielectric film 160.

The conductive interface layer 150 may include a single metal oxide film or a plurality of metal oxide films. The at least one kind of metal element included in the conductive interface layer 150 may include a typical metal (e.g., an alkali metal, an alkaline earth metal, or aluminum (Al)), a transition metal, or a post-transition metal. In example embodiments, the at least one kind of metal element may be selected from aluminum (Al), zirconium (Zr), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), and bismuth (Bi), without being limited thereto.

The metal oxide film included in the conductive interface layer 150 may include a stoichiometric metal oxide film or a non-stoichiometric metal oxide film. For example, the metal oxide film included in the conductive interface layer 150 may include at least one metal oxide selected from aluminum oxide (e.g., $Al_2O_3$); zirconium oxide (e.g., $ZrO_2$); niobium oxide (e.g., $NbO$, $NbO_2$, and $Nb_2O_5$); molybdenum oxide (e.g., $MoO_2$ and $MoO_3$); ruthenium oxide (e.g., $RuO_2$ and $RuO_4$); indium oxide (e.g., $In_2O_3$); tin oxide (e.g., $Sn$, $SnO$, and $SnO_2$); antimony oxide (e.g., $Sb_2O_3$); scandium oxide (e.g., $Sc_2O_3$); titanium oxide (e.g., $TiO$, $TiO_2$, $Ti_2O$, $Ti_2O$, $Ti_3O$, $Ti_3O_5$, and $Ti_4O_7$); vanadium oxide (e.g., $V_2O_5$); manganese oxide (e.g., $MnO$, $Mn_3O_4$, and $Mn_2O_3$); iron oxide (e.g., $FeO$, $FeO_2$, $Fe_3O_4$, and $Fe_2O_3$); cobalt oxide (e.g., $CoO$, $Co_2O_3$, and $Co_3O_4$); nickel oxide (e.g., $NiO$); arsenic oxide (e.g., $As_2O_3$, $As_2O_4$, and $As_2O_5$); tantalum oxide (e.g., $Ta_2O_5$); tungsten oxide (e.g., $WO_2$, $WO_3$, $W_2O_3$, and $W_2O_5$); iridium oxide (e.g., $IrO_2$); yttrium oxide (e.g., $Y_2O_3$); bismuth oxide (e.g., $Bi_2O_3$); and a combination thereof.

In example embodiments, the conductive interface layer 150 may include a metal oxide film including one kind of metal element selected from the metal elements described above. In other example embodiments, the conductive interface layer 150 may include a metal oxide film including at least two different metal elements (e.g., at least two kinds of metal elements) selected from the metal elements described above.

A thickness TH1 of the conductive interface layer 150 may be less than a thickness TH2 of the dielectric film 160. In example embodiments, the thickness TH1 of the conductive interface layer 150 may be in a range of about 1 angstrom (Å) to about 50 Å, without being limited thereto.

The dielectric film 160 may include a high-k dielectric film. As used herein, the term "high-k dielectric film" refers to a dielectric film having a higher dielectric constant than a silicon oxide film. In example embodiments, the dielectric film 160 may include a metal oxide including at least one metal selected from hafnium (Hf), zirconium (Zr), aluminum (Al), niobium (Nb), cerium (Ce), lanthanum (La), tantalum (Ta), and titanium (Ti). In example embodiments, the dielectric film 160 may have a single film structure including one high-k dielectric film. In other example embodiments, the dielectric film 160 may have a multilayered structure including a plurality of high-k dielectric films. The high-k dielectric film may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof, without being limited thereto. In example embodiments, a thickness TH2 of the dielectric film 160 may be in a range of about 20 Å to about 80 Å, without being limited thereto.

Figure 2:
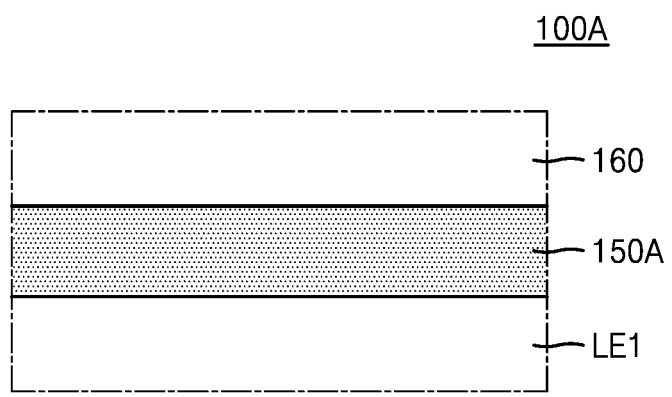
FIG. 2 is a cross-sectional view of main components of an IC device according to embodiments.

FIG. 2 is a cross-sectional view of main components of an IC device 100A according to embodiments. In FIG. 2, the same reference numerals are used to denote the same elements as in FIG. 1, and detailed descriptions thereof are omitted.

Referring to FIG. 2, the IC device 100A may have substantially the same configuration as the IC device 100 described with reference to FIG. 1. However, the IC device 100A may include a conductive interface layer 150A instead of the conductive interface layer 150.

The conductive interface layer 150A may have substantially the same configuration as the conductive interface layer 150 described with reference to FIG. 1. However, the conductive interface layer 150A may include a single film.

In example embodiments, the conductive interface layer 150A may include a metal oxide film including at least one kind of metal element selected from aluminum (Al), zirconium (Zr), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), and bismuth (Bi). For example, the conductive interface layer 150A may include two or three metal elements (e.g., two or three kinds of metal elements) selected from the metal elements described above. For example, the conductive interface layer 150A may include a single metal oxide film including Al, Ti, Nb or a combination thereof.

Figure 3:
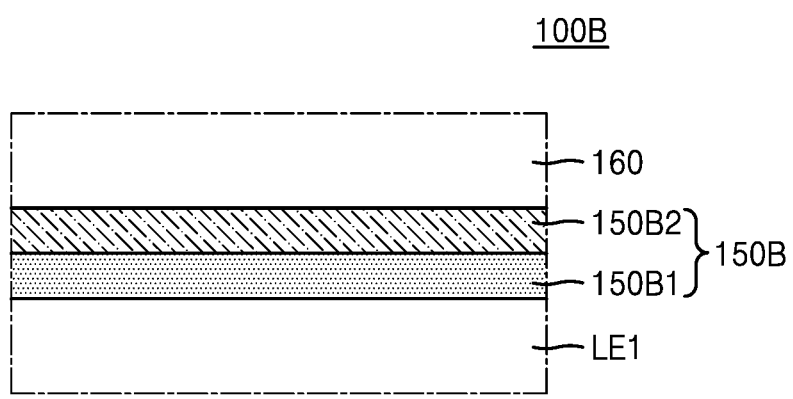
FIG. 3 is a cross-sectional view of main components of an IC device according to embodiments.

FIG. 3 is a cross-sectional view of main components of an IC device 100B according to embodiments. In FIG. 3, the same reference numerals are used to denote the same elements as in FIG. 1, and detailed descriptions thereof are omitted.

Referring to FIG. 3, the IC device 100B may have substantially the same configuration as the IC device 100 described with reference to FIG. 1. However, the IC device 100B may include a conductive interface layer 150B instead of the conductive interface layer 150.

The conductive interface layer 150B may have substantially the same configuration as the conductive interface layer 150 described with reference to FIG. 1. However, the conductive interface layer 150B may include a double (i.e., two-layer) film.

The conductive interface layer 150B may include a first interface sub-layer 150B1 and a second interface sub-layer 150B2, which sequentially cover the lower electrode LE1. Accordingly, the first interface sub-layer 150B1 is between the second interface sub-layer 150B2 and the lower electrode LE1. The first interface sub-layer 150B1 and the second interface sub-layer 150B2 may include respective metal oxide films including different respective metal elements. In example embodiments, the first interface sub-layer 150B1 and the second interface sub-layer 150B2 may include respective metal oxide films including different respective metal elements, each of which is selected from aluminum (Al), zirconium (Zr), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), and bismuth (Bi). For example, each of the first interface sub-layer 150B1 and the second interface sub-layer 150B2 may include a metal oxide film selected from aluminum oxide (e.g., $Al_2O_3$); zirconium oxide (e.g., $ZrO_2$); niobium oxide (e.g., NbO, $NbO_2$, and $Nb_2O_5$); molybdenum oxide (e.g., $MoO_2$ and $MoO_3$); ruthenium oxide (e.g., $RuO_2$ and $RuO_4$); indium oxide (e.g., $In_2O_3$); tin oxide (e.g., Sn, SnO, and $SnO_2$); antimony oxide (e.g., $Sb_2O_3$); scandium oxide (e.g., $Sc_2O_3$); titanium oxide (e.g., TiO, $TiO_2$, $Ti_2O$, $Ti_2O$, $Ti_3O$, $Ti_3O_5$, and $Ti_4O_7$); vanadium oxide (e.g., $V_2O_5$); manganese oxide (e.g., MnO, $Mn_3O_4$, and $Mn_2O_3$); iron oxide (e.g., FeO, $FeO_2$, $Fe_3O_4$, and $Fe_2O_3$); cobalt oxide (e.g., CoO, $Co_2O_3$, and $Co_3O_4$); nickel oxide (e.g., NiO); arsenic oxide (e.g., $As_2O_3$, $As_2O_4$, and $As_2O_5$); tantalum oxide (e.g., $Ta_2O_5$); tungsten oxide (e.g., $WO_2$, $WO_3$, $W_2O_3$, and $W_2O_5$); iridium oxide (e.g., $IrO_2$); yttrium oxide (e.g., $Y_2O_3$); bismuth oxide (e.g., $Bi_2O_3$); and a combination thereof. However, the first interface sub-layer 150B1 may include a different material from the second interface sub-layer 150B2. For example, one of the first interface sub-layer 150B1 and the second interface sub-layer 150B2 may include a titanium oxide film, and the other thereof may include an aluminum oxide film or a niobium oxide film, without being limited thereto. As another example, the first interface sub-layer 150B1 may include an aluminum oxide film or a niobium oxide film, and the second interface sub-layer 150B2 may include a tantalum oxide film.

Figure 4:
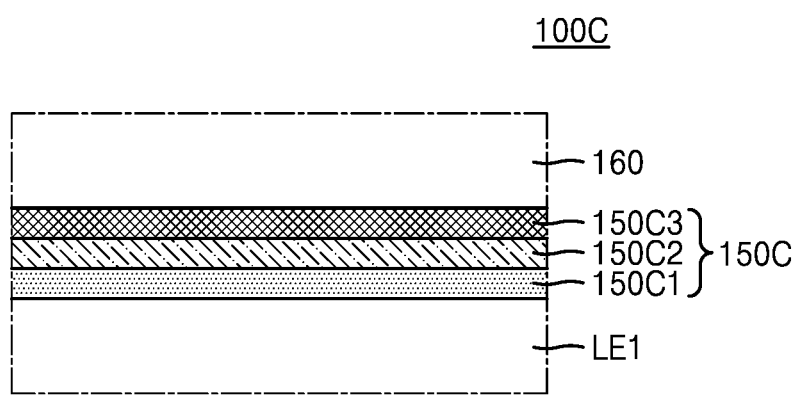
FIG. 4 is a cross-sectional view of main components of an IC device according to embodiments.

FIG. 4 is a cross-sectional view of main components of an IC device 100C according to embodiments. In FIG. 4, the same reference numerals are used to denote the same elements as in FIG. 1, and detailed descriptions thereof are omitted.

Referring to FIG. 4, the IC device 100C may have substantially the same configuration as the IC device 100 described with reference to FIG. 1. However, the IC device 100C may include a conductive interface layer 150C instead of the conductive interface layer 150.

The conductive interface layer 150C may have substantially the same configuration as the conductive interface layer 150 described with reference to FIG. 1. However, the conductive interface layer 150C may include a triple (i.e., three-layer) film.

The conductive interface layer 150C may include a first interface sub-layer 150C1, a second interface sub-layer 150C2, and a third interface sub-layer 150C3, which sequentially cover the lower electrode LE1. Accordingly, the first interface sub-layer 150C1 is between the second interface sub-layer 150C2 and the lower electrode LE1, the second interface sub-layer 150C2 is between the first interface sub-layer 150C1 and the third interface sub-layer 150C3, and the third interface sub-layer 150C3 is between the second interface sub-layer 150C2 and the dielectric film 160. At least two of the first interface sub-layer 150C1, the second interface sub-layer 150C2, and the third interface sub-layer 150C3 may include respective metal oxide films having different metal elements, respectively.

In example embodiments, the first interface sub-layer 150C1, the second interface sub-layer 150C2, and the third interface sub-layer 150C3 may include respective metal oxide films including different respective metal elements.

In other example embodiments, the first interface sub-layer 150C1 and the third interface sub-layer 150C3 may include a first metal element, and the second interface sub-layer 150C2 may include a second metal element, which is different from the first metal element.

Each of the first metal element and the second metal element may be selected from aluminum (Al), zirconium (Zr), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), and bismuth (Bi). In an example, the first interface sub-layer 150C1 and the third interface sub-layer 150C3 may include a titanium oxide film, and the second interface sub-layer 150C2 may include an aluminum oxide film. In another example, the first interface sub-layer 150C1 and the third interface sub-layer 150C3 may include an aluminum oxide film, and the second interface sub-layer 150C2 may include a titanium oxide film. In yet another example, the first interface sub-layer 150C1 and the third interface sub-layer 150C3 may include a niobium oxide film, and the second interface sub-layer 150C2 may include a tantalum oxide film.

In still other example embodiments, at least one of the first interface sub-layer 150C1, the second interface sub-layer 150C2, and the third interface sub-layer 150C3 may have the same configuration as the conductive interface layer 150A described with reference to FIG. 2.

Figure 5:
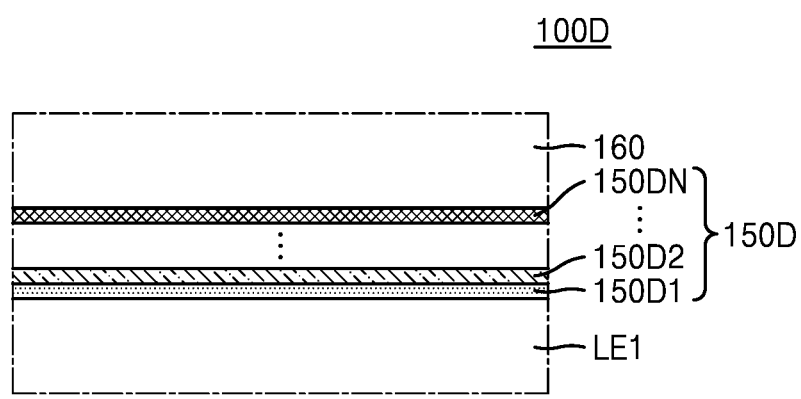
FIG. 5 is a cross-sectional view of main components of an IC device according to embodiments.

FIG. 5 is a cross-sectional view of main components of an IC device 100D according to embodiments. In FIG. 5, the same reference numerals are used to denote the same elements as in FIG. 1, and detailed descriptions thereof are omitted.

Referring to FIG. 5, the IC device 100D may have substantially the same configuration as the IC device 100 described with reference to FIG. 1. However, the IC device 100D may include a conductive interface layer 150D instead of the conductive interface layer 150.

The conductive interface layer 150D may have substantially the same configuration as the conductive interface layer 150 described with reference to FIG. 1. However, the conductive interface layer 150D may include a multilayered film including a plurality of interface sub-layers 150D1, 150D2, ..., and 150DN.

In example embodiments, at least one of the plurality of interface sub-layers 150D1, 150D2, ..., and 150DN may have the same configuration as the conductive interface layer 150A described with reference to FIG. 2. In other example embodiments, at least one of the plurality of interface sub-layers 150D1, 150D2, ..., and 150DN may have the same configuration as the first interface sub-layer 150B1 or the second interface sub-layer 150B2, which has been described with reference to FIG. 3. In still other example embodiments, at least one of the plurality of interface sub-layers 150D1, 150D2, ..., and 150DN may have the same configuration as the first interface sub-layer 150C1, the second interface sub-layer 150C2, or the third interface sub-layer 150C3, which has been described with reference to FIG. 4. In still other example embodiments, the plurality of interface sub-layers 150D1, 150D2, ..., and 150DN may have a structure in which a first interface sub-layer including a first metal element and a second interface sub-layer including a second metal element are alternately stacked one by one. The second metal element may be different from the first metal element. Details of the first metal element and the second metal element may be the same as those described with reference to FIG. 4.

In the IC devices 100, 100A, 100B, 100C, and 100D described with reference to FIGS. 1 to 5, the conductive interface layers 150, 150A, 150B, 150C, and 150D may be between the lower electrode LE1 and the dielectric film 160, and thus, a depletion layer may be inhibited (e.g., prevented) from being generated in a portion of the lower electrode LE1 that is adjacent to the dielectric film 160. Accordingly, an undesired depletion layer may be inhibited (e.g., prevented) from being generated in the lower electrode LE1. Thus, leakage current may be inhibited from occurring in the capacitor CP1, the minimum capacitance of the capacitor CP1 may be increased, and the total capacitance may be increased.

In other example embodiments, as in the IC devices 100, 100A, 100B, 100C, and 100D described with reference to FIGS. 1 to 5, the IC device according to the embodiments may include an upper conductive interface layer between the dielectric film 160 and the upper electrode UE1 in addition to the conductive interface layers 150, 150A, 150B, 150C, and 150D between the lower electrode LE1 and the dielectric film 160. The upper conductive interface layers may have substantially the same structures as the conductive interface layers 150, 150A, 150B, 150C, and 150D described with reference to FIGS. 1 to 5.

In example embodiments, in an IC device according to embodiments, a first stack structure of TiO/ZAZ/TiO may be between the lower electrode LE1 including TiN and the upper electrode UE1 including TiN. In other example embodiments, in an IC device according to embodiments, a second stack structure of TiO/TaO/ZAZ/TiO may be between the lower electrode LE1 including TiN and the upper electrode UE1 including TiN. Herein, TiO may refer to a titanium oxide film, TaO may refer to a tantalum oxide film, and ZAZ may refer to a multilayered film in which a zirconium oxide film and an aluminum oxide film are stacked.

In still other example embodiments, as in the IC devices 100, 100A, 100B, 100C, and 100D described with reference to FIGS. 1 to 5, in the IC device according to the embodiments, the conductive interface layers 150, 150A, 150B, 150C, and 150D may be between the lower electrode LE1 and the dielectric film 160, and an upper local region of the lower electrode LE1, which corresponds to a partial thickness from a top surface of the lower electrode LE1, which is in contact with the conductive interface layers 150, 150A, 150B, 150C, and 150D, toward the inside of the lower electrode LE1, may include at least one kind of metal element, which has been diffused from the conductive interface layers 150, 150A, 150B, 150C, and 150D. In the upper local region, the at least one kind of metal element may be included at a content of about 1 atomic percent (at %) to about 50 at %, for example, a content of about 5 at % to about 35 at %, without being limited thereto.

Figure 6:
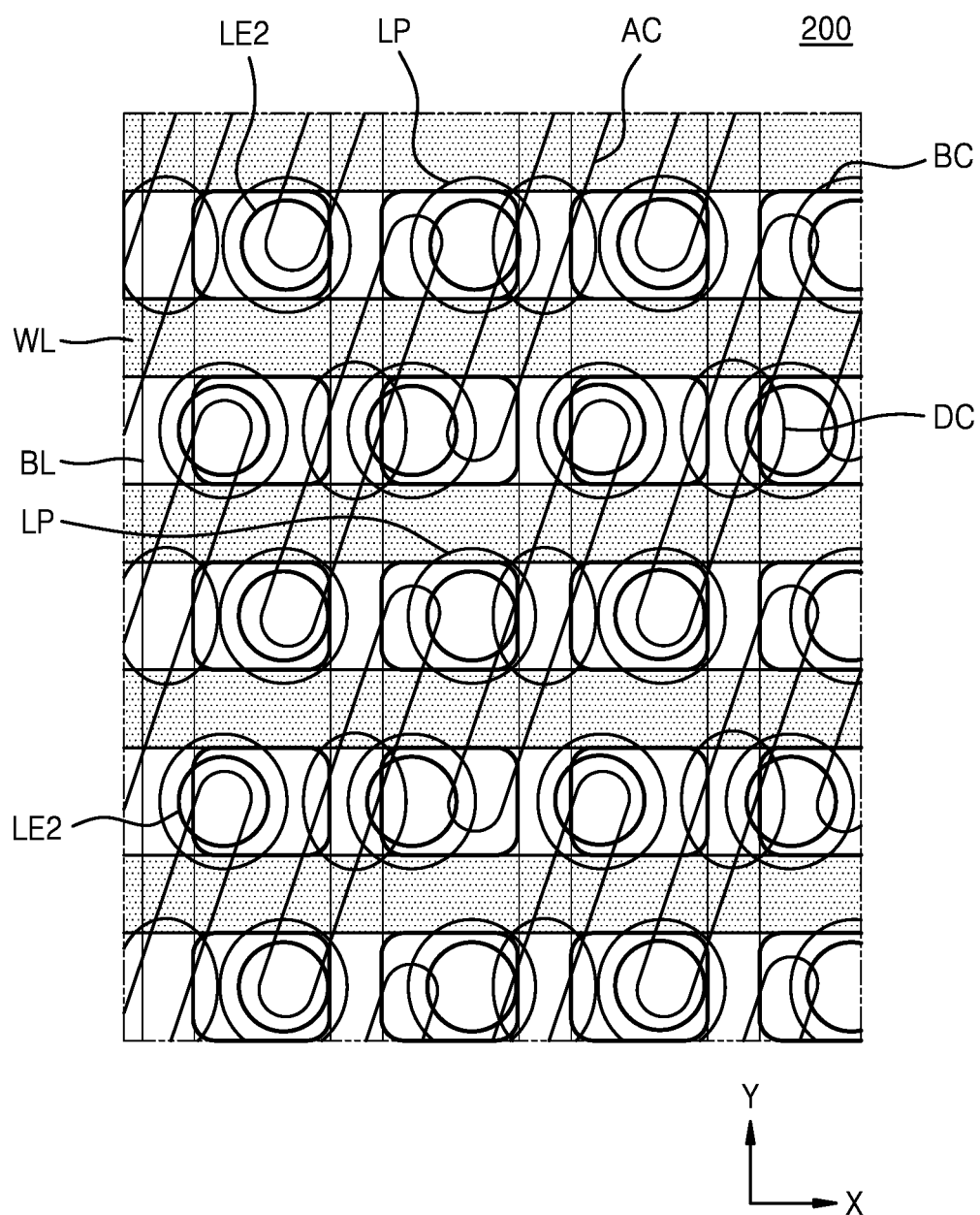
FIG. 6 illustrates a schematic plan layout of some components of a memory cell array region of an IC device, according to embodiments.

FIG. 6 illustrates a schematic plan layout of some components of a memory cell array region of an IC device 200, according to embodiments.

Referring to FIG. 6, the IC device 200 may include a plurality of active regions AC, which extend in a lateral direction at an angle to an X direction and a Y direction on a plane. A plurality of word lines WL may intersect with the plurality of active regions AC and extend parallel to each other in the X direction. A plurality of bit lines BL may be on the plurality of word lines WL and extend parallel to each other in the Y direction, which intersects with the X direction. Each of the plurality of bit lines BL may be connected to the active region AC through a direct contact DC.

A plurality of buried contacts BC may be formed between two adjacent ones of the plurality of bit lines BL. A plurality of conductive landing pads LP may be formed on the plurality of buried contacts BC. At least a portion of each of the plurality of conductive landing pads LP may overlap a buried contact BC. A plurality of lower electrodes LE2 may be formed on the plurality of conductive landing pads LP and be spaced apart from each other. The plurality of lower electrode LE2 may be connected to the plurality of active regions AC through the plurality of buried contacts BC and the plurality of conductive landing pads LP.

Figure 7A:
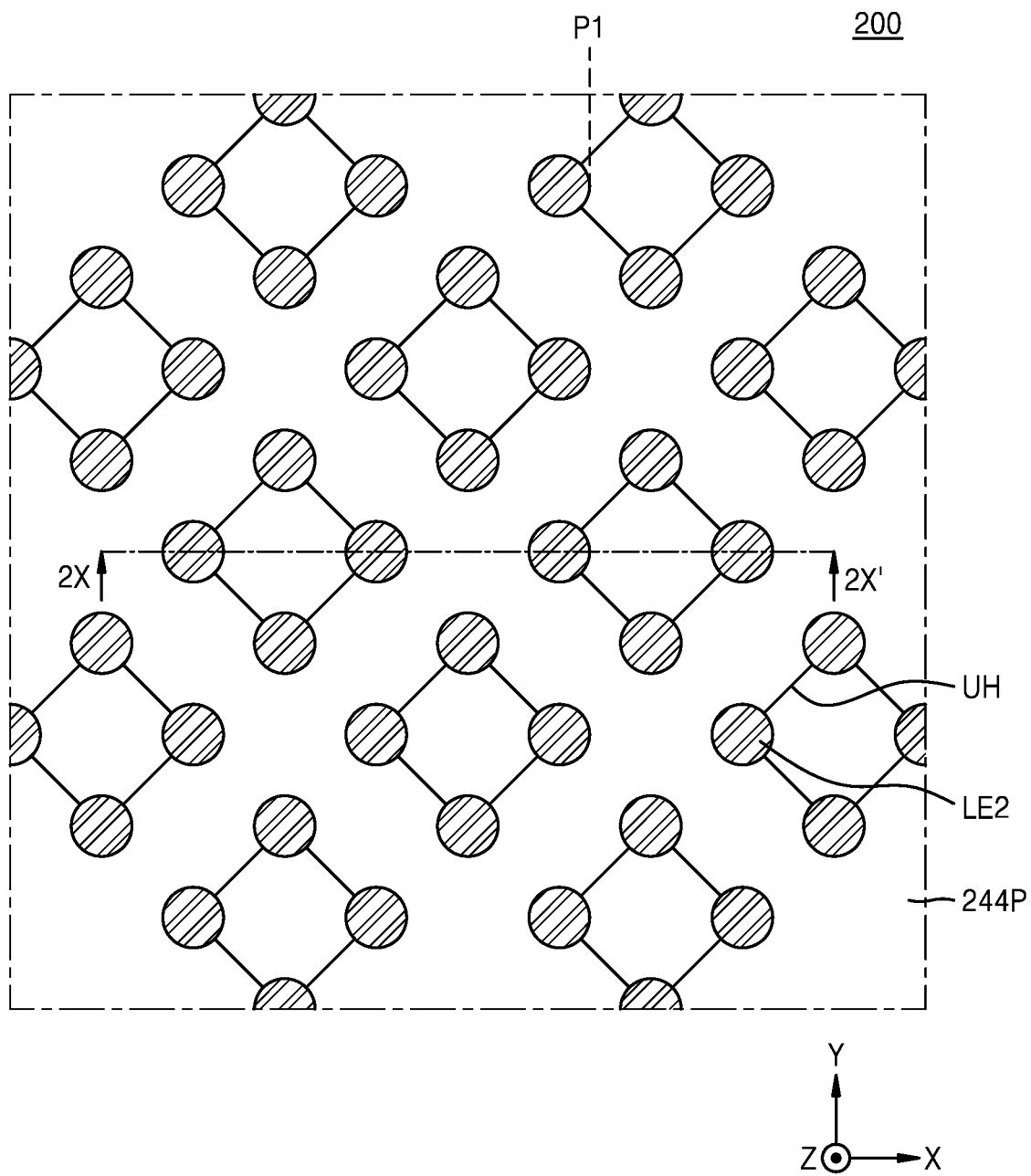
FIG. 7A is a plan view of some components of the IC device shown in FIG. 6.
Figure 7B:
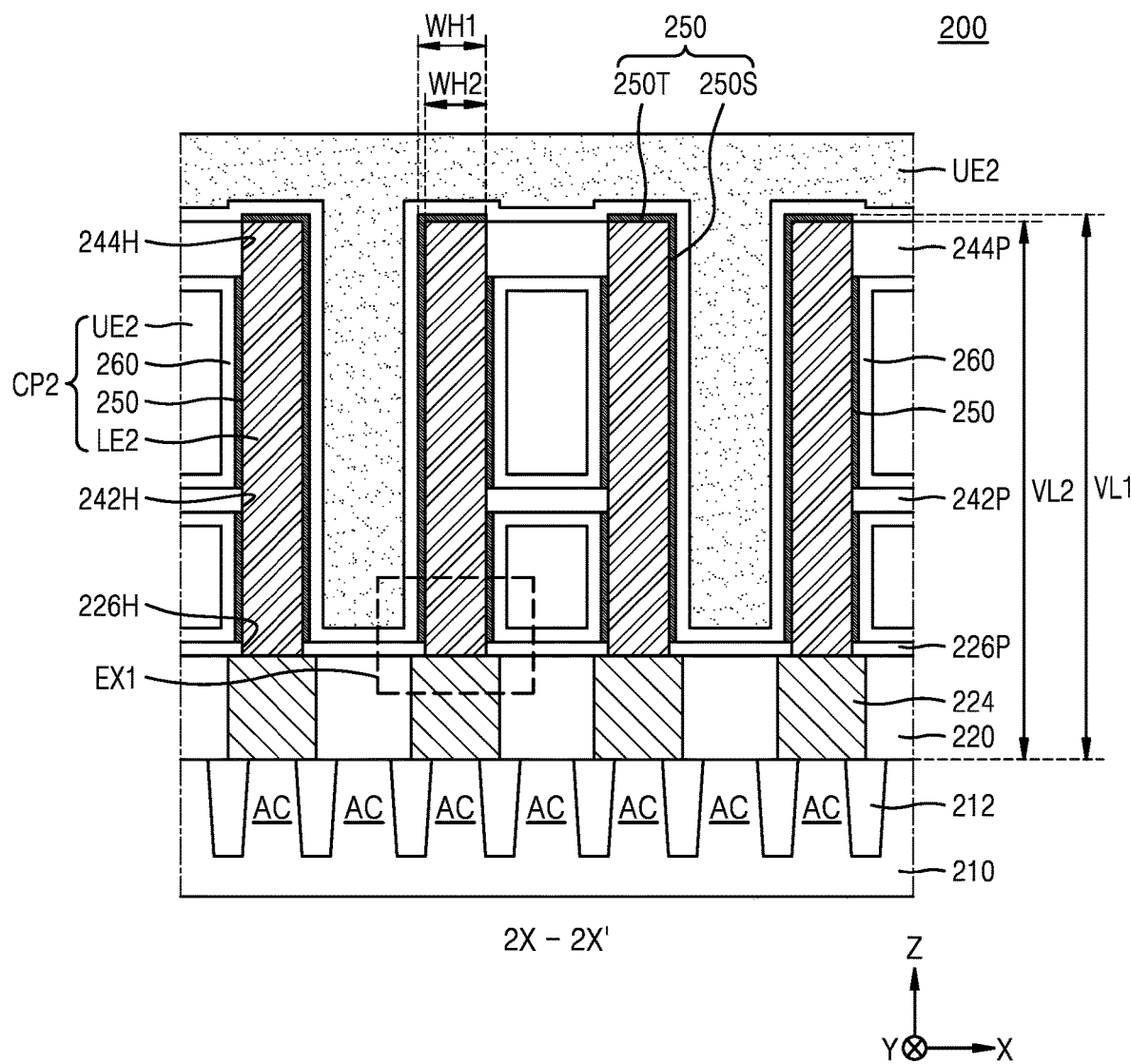
FIG. 7B is a schematic cross-sectional view of some components corresponding to a cross-section taken along line 2X-2X' of FIG. 7A.
Figure 7C:
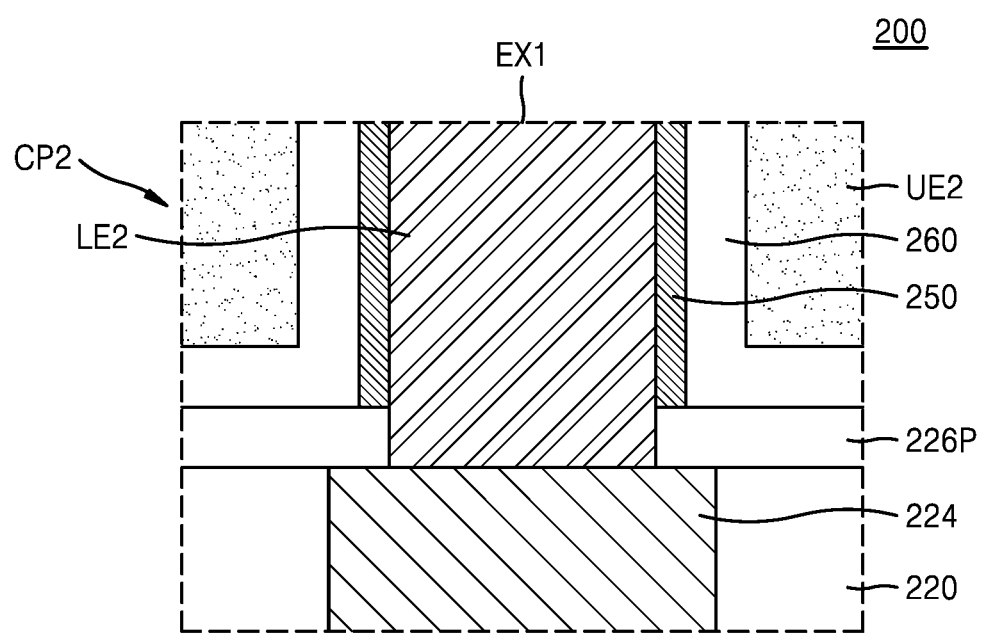
FIG. 7C is an enlarged cross-sectional view of a region "EX1" of FIG. 7B.
Figure 7D:
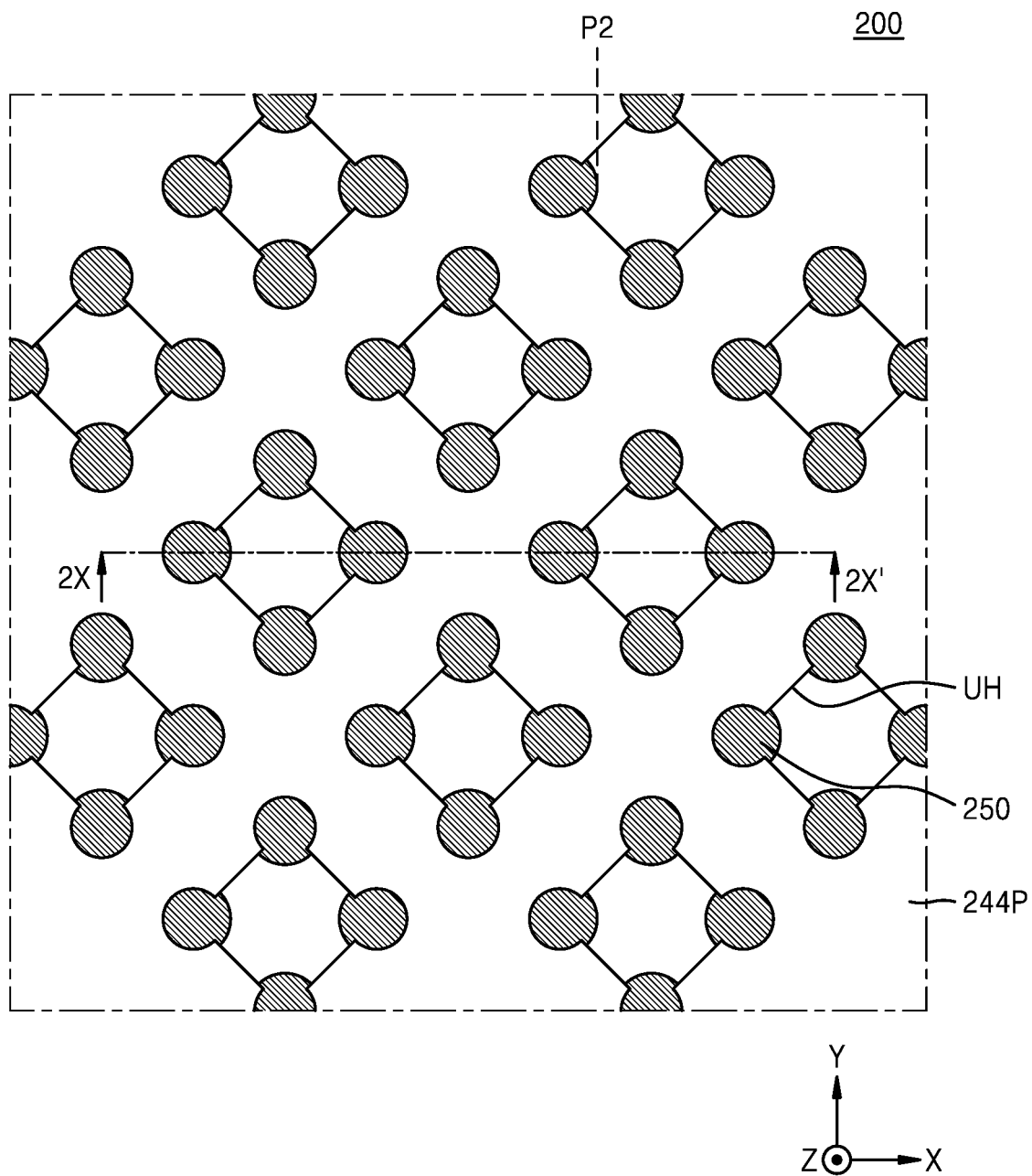
FIG. 7D is a plan view of some other components of the IC device shown in FIG. 7A.

FIG. 7A is a plan view of some components of the IC device 200 shown in FIG. 6. FIG. 7B is a schematic cross-sectional view of some components corresponding to a cross-section taken along line 2X-2X' of FIG. 7A. FIG. 7C is an enlarged cross-sectional view of region "EX1" of FIG. 7B. FIG. 7D is a plan view of some other components of the IC device 200 shown in FIG. 7A.

Referring to FIGS. 7A to 7D, the IC device 200 may include a substrate 210 including a plurality of active regions AC and a lower structure 220 formed on the substrate 210. A plurality of conductive regions 224 may pass through the lower structure 220 and be connected to the plurality of active regions AC.

The substrate 210 may include a semiconductor element, such as Si and Ge, or a compound semiconductor, such as SiC, GaAs, InAs, and InP. The substrate 210 may include a semiconductor substrate, and structures including at least one insulating film or at least one conductive region, which are formed on the semiconductor substrate. The at least one conductive region may include, for example, a doped well or a doped structure. A device isolation film 212 defining the plurality of active regions AC may be formed in the substrate 210. The device isolation film 212 may include an oxide film, a nitride film, or a combination thereof.

In some embodiments, the lower structure 220 may include an insulating film, which includes a silicon oxide film, a silicon nitride film, or a combination thereof. In some other embodiments, the lower structure 220 may include various conductive regions, for example, wiring layers, contact plugs, and transistors, and insulating films that electrically insulate the conductive regions from each other. The plurality of conductive regions 224 may include polysilicon, a metal, a conductive metal nitride, a metal silicide, or a combination thereof. The lower structure 220 may include the plurality of bit lines BL described with reference to FIG. 6. Each of the plurality of conductive regions 224 may include a buried contact BC and a conductive landing pad LP, which are described with reference to FIG. 6.

An insulating pattern 226P having a plurality of openings 226H may be on the lower structure 220 and the plurality of conductive regions 224 and overlap the plurality of conductive regions 224 in a vertical direction (Z direction). The insulating pattern 226P may include a silicon nitride film (SiN), a silicon carbon nitride film (SiCN), a silicon boron nitride film (SiBN), or a combination thereof. As used herein, each of the terms "SiN," "SiCN," and "SiBN" refers to a material including elements included therein, without referring to a chemical formula representing a stoichiometric relationship.

A plurality of capacitors CP2 may be on the plurality of conductive regions 224. Each of the plurality of capacitors CP2 may include a lower electrode LE2, a conductive interface layer 250 and a dielectric film 260, which are sequentially stacked on the lower electrode LE2, and an upper electrode UE2 on (e.g., covering) the dielectric film 260.

The insulating pattern 226P may be adjacent to a lower end of each of a plurality of lower electrodes LE2. Each of the plurality of lower electrodes LE2 may have a pillar shape, which extends long from a top surface of the conductive region 224 through the opening 226H of the insulating pattern 226P in a direction away from the substrate 210 in the vertical direction (Z direction). Although FIG. 7B illustrates an example in which each of the plurality of lower electrodes LE2 has a pillar shape, the inventive concept is not limited thereto. For example, each of the plurality of lower electrodes LE2 may have a cup-shaped sectional structure or a cylindrical sectional structure with a blocked bottom portion.

The plurality of lower electrodes LE2 may be supported by the lower insulating support pattern 242P and the upper insulating support pattern 244P. The plurality of lower electrodes LE2 may be opposite the upper electrode UE2, with the conductive interface layer 250 and the dielectric film 260 therebetween.

The conductive interface layer 250 may be between the lower electrode LE2 and the dielectric film 260. The conductive interface layer 250 may conformally cover an outer sidewall and an uppermost surface of the lower electrode LE2. The conductive interface layer 250 may not be between the lower electrode LE2 and the insulating pattern 226P, between the lower electrode LE2 and the lower insulating support pattern 242P, and between the lower electrode LE2 and the upper insulating support pattern 244P. The conductive interface layer 250 may not be between the insulating pattern 226P and the dielectric film 260, between the lower insulating support pattern 242P and the dielectric film 260, and between the upper insulating support pattern 244P and the dielectric film 260.

The dielectric film 260 may be on (e.g., may cover) the lower electrode LE2, the lower insulating support pattern 242P, and the upper insulating support pattern 244P. The dielectric film 260 may include portions in contact with the insulating pattern 226P, the conductive interface layer 250, the lower insulating support pattern 242P, and the upper insulating support pattern 244P, respectively. Portions of the dielectric film 260, which face the lower electrode LE2, may be spaced apart from the lower electrode LE2, with the conductive interface layer 250 therebetween. The dielectric film 260 may not include a portion in contact with the lower electrode LE2.

The upper electrode UE2 may be opposite the plurality of lower electrodes LE2, with the conductive interface layer 250 and the dielectric film 260 therebetween.

Constituent materials of the plurality of lower electrodes LE2, the conductive interface layer 250, the dielectric film 260, and the upper electrode UE2 may be substantially the same as those of the lower electrode LE1, the conductive interface layer 150, the dielectric film 160, and the upper electrode UE1, respectively, which have been described with reference to FIG. 1.

As shown in FIG. 7B, the uppermost surface of the lower electrode LE2 may planarly extend without a step or break in a lateral direction (a direction along an X-Y plane in FIG. 7B). The conductive interface layer 250 may include an interface top portion 250T and an interface side portion 250S. The interface top portion 250T may be in contact with the uppermost surface of the lower electrode LE2 and extend without a step or break in the lateral direction. The interface side portion 250S may be integrally connected to the interface top portion 250T and in contact with the outer sidewall of the lower electrode LE2. A width WH1 of the interface top portion 250T may be greater than a width WH2 of the uppermost surface of the lower electrode LE2 in the lateral direction.

The upper insulating support pattern 244P may extend in the lateral direction, which is parallel to the substrate 210, while surrounding an upper end of each of the plurality of lower electrodes LE2. A plurality of holes 244H through which the plurality of lower electrodes LE2 pass may be formed in the upper insulating support pattern 244P. An inner sidewall of each of the plurality of holes 244H formed in the upper insulating support pattern 244P may be in contact with the outer sidewall of the lower electrode LE2. A top surface of each of the plurality of lower electrodes LE2 may be coplanar with a top surface of the upper insulating support pattern 244P.

A first vertical distance VL1 from the substrate 210 to an uppermost surface of the conductive interface layer 250 may be greater than a second vertical distance VL2 from the substrate 210 to an uppermost surface of the upper insulating support pattern 244P.

The lower insulating support pattern 242P may extend in the lateral direction, which is parallel to the substrate 210, and be in contact with the outer sidewalls of the plurality of lower electrodes LE2 between the substrate 210 and the upper insulating support pattern 244P. A plurality of holes 242H, through which the plurality of lower electrodes LE2 pass, and a plurality of lower holes (refer to LH in FIG. 14E) may be formed in the lower insulating support pattern 242P. The plurality of lower electrodes LE2 may pass through the plurality of holes 244H formed in the upper insulating support pattern 244P and the plurality of holes 242H formed in the lower insulating support pattern 242P and extend in the vertical direction (Z direction).

As shown in FIG. 7A, a plurality of upper holes UH may be formed in the upper insulating support pattern 244P. FIG. 7A illustrates an example configuration in which a planar shape of each of the plurality of upper holes UH is substantially a rhombic planar shape of which vertices are respectively formed by four adjacent lower electrodes LE2. However, the planar shape of each of the plurality of upper holes UH is not limited to that shown in FIG. 7A and may be variously modified and changed within the scope of the inventive concept. The plurality of lower holes LH having a planar shape corresponding to the planar shape of the plurality of upper holes UH may be formed in the lower insulating support pattern 242P.

FIG. 7A illustrates a planar structure of each of the upper insulating support pattern 244P and the plurality of lower electrodes LE2, and FIG. 7D illustrates a planar structure of each of the upper insulating support pattern 244P and the conductive interface layer 250. As shown in FIG. 7A, the plurality of lower electrodes LE2 may include portions, which protrude toward the center of the upper hole UH to a first point P1. As shown in FIG. 7D, the conductive interface layer 250 may include portions, which protrude toward the center of the upper hole UH to a second point P2 that is closer to the center of the upper hole UH than the first point P1.

Each of the lower insulating support pattern 242P and the upper insulating support pattern 244P may include a silicon nitride film (SiN), a silicon carbon nitride film (SiCN), a silicon boron nitride film (SiBN), or a combination thereof. In example embodiments, the lower insulating support pattern 242P may include the same material as the upper insulating support pattern 244P. In other example embodiments, the lower insulating support pattern 242P may include a different material from the upper insulating support pattern 244P. In an example, each of the lower insulating support pattern 242P and the upper insulating support pattern 244P may include SiCN. In another example, the lower insulating support pattern 242P may include SiCN, and the upper insulating support pattern 244P may include SiBN. However, the inventive concept is not limited to the materials described above.

Figure 8:
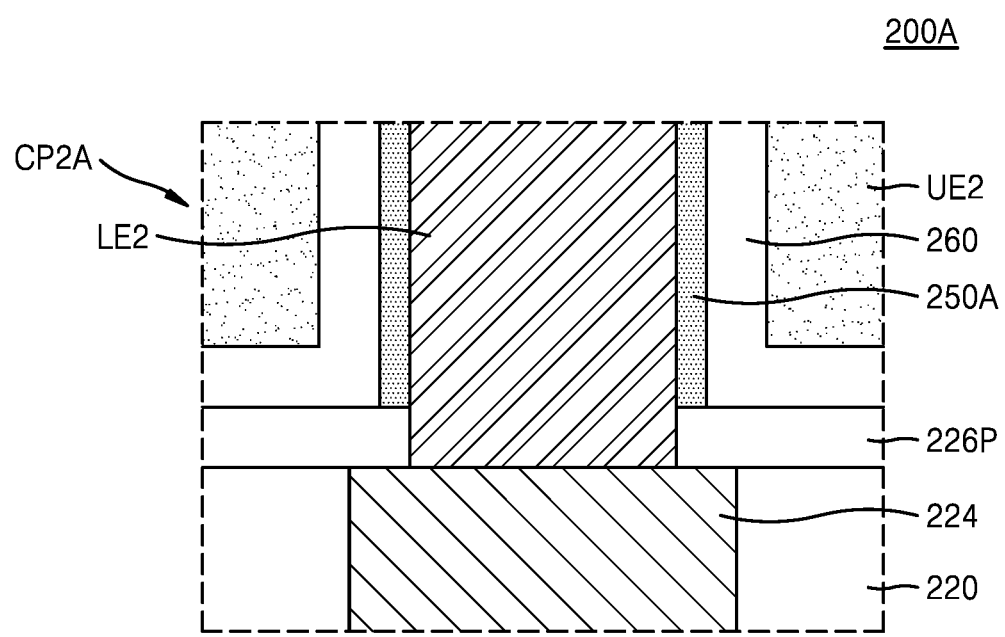
FIG. 8 is a cross-sectional view of main components of an IC device according to embodiments.

FIG. 8 is a cross-sectional view of main components of an IC device 200A according to embodiments. In FIG. 8, the same reference numerals are used to denote the same elements as in FIGS. 7A to 7D, and detailed descriptions thereof are omitted. FIG. 8 illustrates an enlarged cross-sectional configuration of a region corresponding to region "EX1" of FIG. 7B.

Referring to FIG. 8, the IC device 200A may have substantially the same configuration as the IC device 200 described with reference to FIGS. 7A to 7D. However, the IC device 200A may include a capacitor CP2A including a conductive interface layer 250A instead of the conductive interface layer 250.

The conductive interface layer 250A may have substantially the same configuration as the conductive interface layer 250 described with reference to FIGS. 7A to 7D. However, the conductive interface layer 250A may include a single film. Details of a constituent material of the conductive interface layer 250A may be the same as that of the conductive interface layer 150A, which has been described with reference to FIG. 2.

Figure 9:
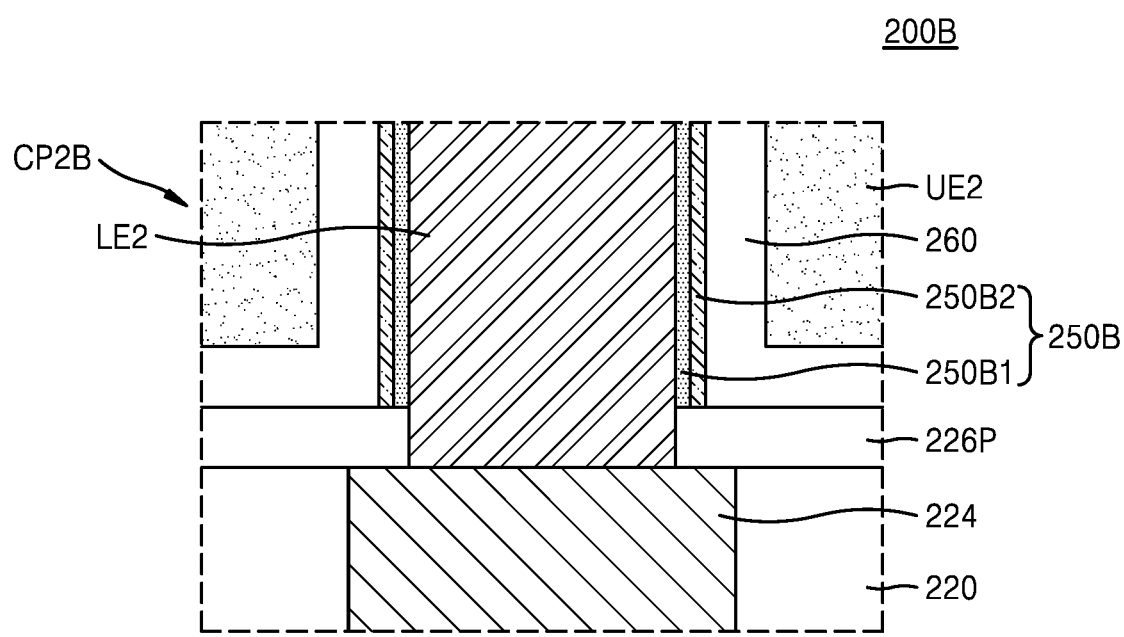
FIG. 9 is a cross-sectional view of main components of an IC device according to embodiments.

FIG. 9 is a cross-sectional view of main components of an IC device 200B according to embodiments. In FIG. 9, the same reference numerals are used to denote the same elements as in FIGS. 7A to 7D, and detailed descriptions thereof are omitted. FIG. 9 illustrates an enlarged cross-sectional configuration of a region corresponding to region "EX1" of FIG. 7B.

Referring to FIG. 9, the IC device 200B may have substantially the same configuration as the IC device 200 described with reference to FIGS. 7A to 7D. However, the IC device 200B may include a capacitor CP2B including a conductive interface layer 250B instead of the conductive interface layer 250.

The conductive interface layer 250B may have substantially the same configuration as the conductive interface layer 250 described with reference to FIGS. 7A to 7D. However, the conductive interface layer 250B may include a double (i.e., two-layer) film. The conductive interface layer 250B may include a first interface sub-layer 250B1 and a second interface sub-layer 250B2, which sequentially cover the lower electrode LE2. The first interface sub-layer 250B1 and the second interface sub-layer 250B2 may include respective metal oxide films including different respective metal elements. Detailed compositions of constituent materials of the first interface sub-layer 250B1 and the second interface sub-layer 250B2 may be the same as those of the first interface sub-layer 150B1 and the second interface sub-layer 150B2, which have been described with reference to FIG. 3.

Figure 10:
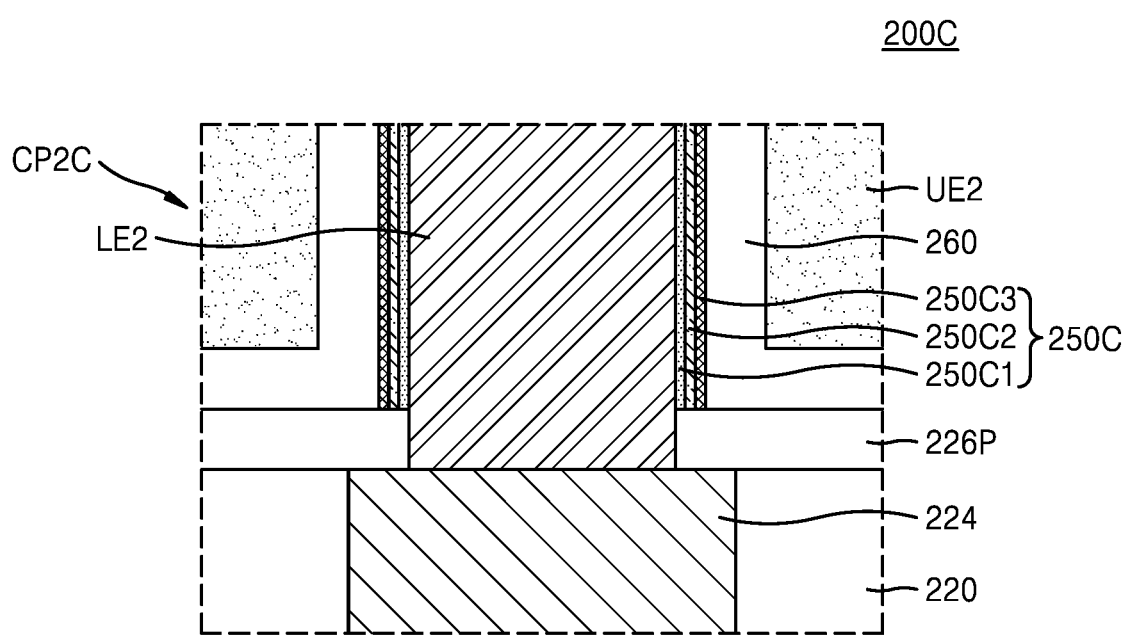
FIG. 10 is a cross-sectional view of main components of an IC device according to embodiments.

FIG. 10 is a cross-sectional view of main components of an IC device 200C according to embodiments. In FIG. 10, the same reference numerals are used to denote the same elements as in FIGS. 7A to 7D, and detailed descriptions thereof are omitted. FIG. 10 illustrates an enlarged cross-sectional configuration of a region corresponding to region "EX1" of FIG. 7B.

Referring to FIG. 10, the IC device 200C may have substantially the same configuration as the IC device 200 described with reference to FIGS. 7A to 7D. However, the IC device 200C may include a capacitor CP2C including a conductive interface layer 250C instead of the conductive interface layer 250.

The conductive interface layer 250C may have substantially the same configuration as the conductive interface layer 250 described with reference to FIGS. 7A to 7D. However, the conductive interface layer 250C may include a triple (i.e., three-layer) film. The conductive interface layer 250C may include a first interface sub-layer 250C1, a second interface sub-layer 250C2, and a third interface sub-layer 250C3, which sequentially cover the lower electrode LE2. At least two of the first interface sub-layer 250C1, the second interface sub-layer 250C2, and the third interface sub-layer 250C3 may include respective metal oxide films including different respective metal elements. In example embodiments, two adjacent ones of the first interface sub-layer 250C1, the second interface sub-layer 250C2, and the third interface sub-layer 250C3 may include different respective metal elements. For example, the first interface sub-layer 250C1 and the third interface sub-layer 250C3 may include a first metal element, and the second interface sub-layer 250C2 may include a second metal element, which is different from the first metal element. In other example embodiments, the first interface sub-layer 250C1, the second interface sub-layer 250C2, and the third interface sub-layer 250C3 may include respective metal oxide films including different metal elements, respectively.

Detailed compositions of constituent materials of the first interface sub-layer 250C1, the second interface sub-layer 250C2, and the third interface sub-layer 250C3 may be the same as those of the first interface sub-layer 150C1, the second interface sub-layer 150C2, and the third interface sub-layer 150C3, which have been described with reference to FIG. 4.

In the IC devices 200, 200A, 200B, 200C described with reference to FIGS. 6 to 10, the conductive interface layers 250, 250A, 250B, and 250C may be between the plurality of lower electrodes LE2 and the dielectric film 260, and thus, a depletion layer may be inhibited (e.g., prevented) from being generated in portions of the plurality of lower electrodes LE2 that are adjacent to the dielectric film 260. Thus, an undesired depletion layer may be inhibited (e.g., prevented) from being generated in the plurality of lower electrodes LE2, and thus, the generation of a leakage current may be inhibited in the capacitors CP2, CP2A, CP2B, and CP2C. In addition, as compared with a conventional capacitor that is devoid of the conductive interface layers 250, 250A, 250B, and 250C, the capacitors CP2, CP2A, CP2B, and CP2C having relatively small equivalent oxide film thicknesses may be obtained at the same level of leakage current, the minimum capacitances of the capacitors CP2, CP2A, CP2B, and CP2C may be increased, and the total capacitance may be increased.

Figure 11:
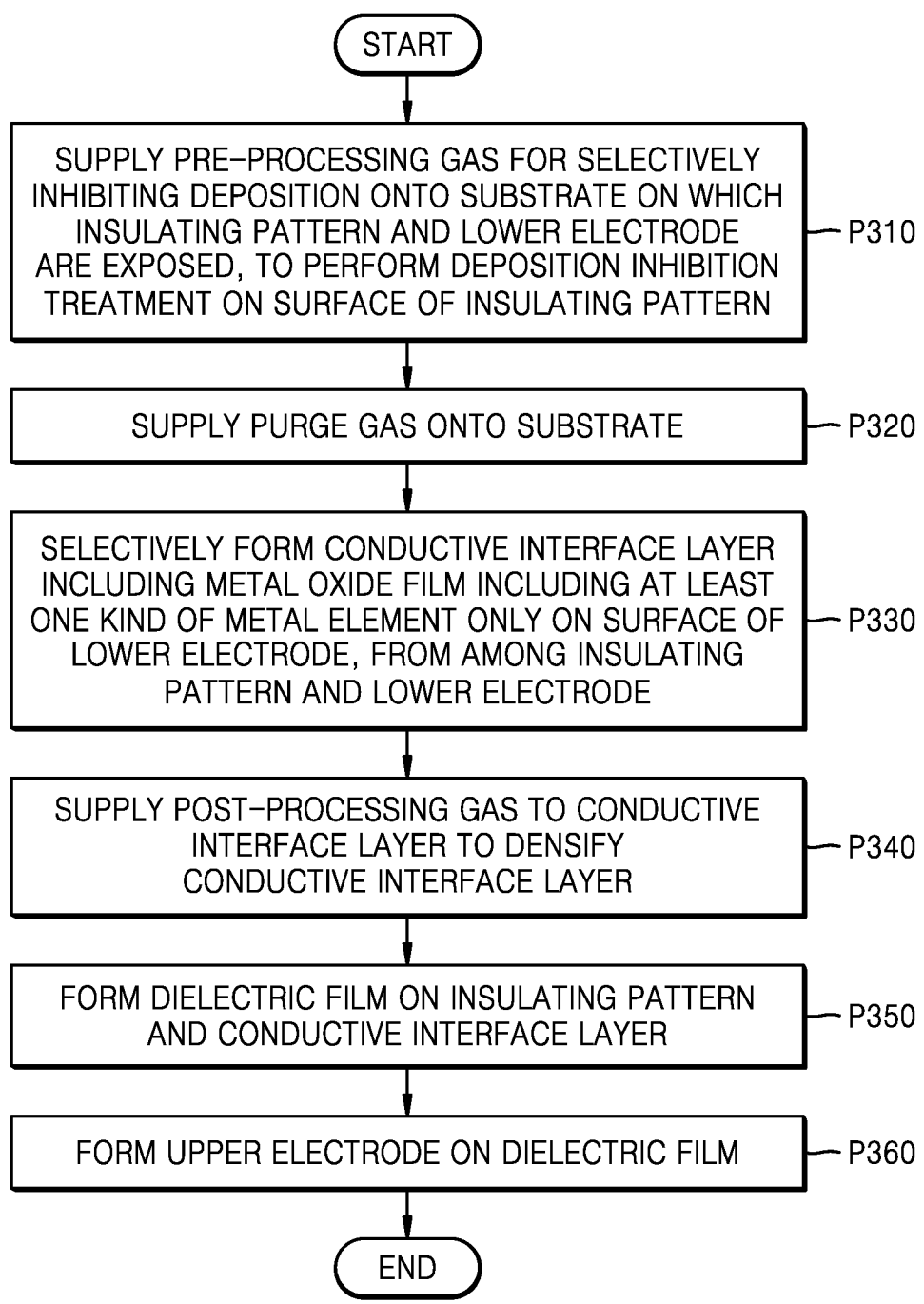
FIG. 11 is a flowchart of a method of manufacturing an IC device, according to embodiments.

FIG. 11 is a flowchart of a method of manufacturing an IC device, according to embodiments. A method of manufacturing an IC device, according to an example embodiment, will now be described with reference to FIGS. 11 and 7B. In the present example embodiment, to form a conductive interface layer 250 shown in FIG. 7B, an area selective deposition (ASD) process may be used.

In process P310 of FIG. 11, a structure in which the insulating pattern 226P and the lower electrode LE2 are exposed may be formed on a substrate 210. Thereafter, a pre-processing gas for selectively inhibiting deposition may be supplied onto the substrate 210 on which the insulating pattern 226P and the lower electrode LE2 are exposed, and thus, a deposition inhibition treatment may be performed on a surface of the insulating pattern 226P, from among the lower electrode LE2 and the insulating pattern 226P. As a result, when the conductive interface layer 250 is formed in subsequent process P330, the surface of the insulating pattern 226P, which has been treated to inhibit deposition as in process P310, may have no or very low chemical affinity with a precursor including a metal element, which is supplied to form the conductive interface layer 250, while a surface of the lower electrode LE2 may have a relatively high affinity with the precursor.

The pre-processing gas may include $H_2$, $N_2$, Ar, $O_2$, $O_3$, $H_2O$, $NH_3$, a silicon (Si)-containing organic compound, a phosphorus (P)-containing organic compound, a sulfur (S)-containing organic compound, a halogen element-containing organic compound, a nitrogen (N)-containing organic compound, a hydroxyl-containing organic compound, organo aminosilane, or a combination thereof, without being limited thereto.

In example embodiments, the pre-processing gas may have a structure represented by Formula 1:

wherein $X^1$ denotes $-Si(OCH_3)_3$, $-Si-(OCH_3)_2$, $-Si(OCH_2CH_3)_3$, $-COOH$, $-SOOH$, $-POOOH$, $-SiCl(CH_3)_2$, $-SiCl_2CH_3$, $-SiCl_3$, $-SiI_3$, $-Si(OH)$, $-SiCl$,—$SO_3H_2$, $-COCl$, $-PO_3H$, $-SO_2Cl$, $-OPOCl_2$, or $-POCl_2$, $X^2$ denotes $-O-$, a C1-C20 alkylene group substituted or unsubstituted with F, or a C3-C20 saturated or unsaturated hydrocarbon-ring-containing group, and $X^3$ denotes $-H$, $-OH$, $-NO_2$, $-NH_2$, $-SH$, $-CH_3$, $-CF$, $-Cl$, or $-C_6H_5$.

In other example embodiments, the pre-processing gas may include organo aminosilane. For example, the organo aminosilane may be selected from dimethylaminotrimethylsilane (DMATMS, $(CH_3)_2-N-Si-(CH_3)_3$), bis(dimethylamino)dimethylsilane (BDMADMS), bis-(dimethylamino)phenylmethylsilane, tris-(dimethylamino)methylsilane, 3-aminopropyl triethoxysilane, N,N-dimethyl-3-aminopropyl triethoxysilane, N-phenylaminopropyl trimethoxysilane, triethoxysilylpropylethylene diamine, trimethoxysilylpropylethylene diamine, trimethoxysilylpropyldiethylene triamine, N-aminoethyl-3-aminopropyl trimethoxysilane, N-2-aminoethyl-3-aminopropyl trimethoxysilane, N-2-aminoethyl-3-aminopropyl tris(ethylethoxy)silane, p-aminophenyl trimethoxysilane), N,N'-dimethyl-3-aminopropyl triethoxysilane, 3-aminopropylmethyl diethoxysilane, 3-aminopropyl trimethoxysilane, N-methylaminopropyl triethoxysilane, methyl[2-(3-trimethoxysilylpropylamino) ethylamino]-3-proprionate, (N,N'-dimethyl 3-amino)propyl triethoxysilane, N,N-dimethylaminophenyl triethoxysilane, trimethoxysilylpropyldiethylene triamine, $SiI_2H(NH_2)$, $SiI_2H(NHMe)$, $SiI_2H(NHEt)$, $SiI_2H(NMe_2)$, $SiI_2H(NMeEt)$, $SiI_2H(NEt_2)$, $SiI_2(NH_2)_2$, $SiI_2(NHMe)_2$, $SiI_2(NHEt)_2$, $SiI_2(NMe_2)_2$, $SiI_2(NMeEt)_2$, and $SiI_2(NEt_2)_2$, and a combination thereof, without being limited thereto.

When the pre-processing gas is supplied, a process temperature selected in a range of room temperature to about 500° C. may be maintained.

By supplying a pre-processing gas for selectively inhibiting deposition onto the substrate 210 on which the insulating pattern 226P and the lower electrode LE2 are exposed, a reactive functional group may be removed from an exposed surface of the insulating pattern 226P, and the exposed surface of the insulating pattern 226P may be maintained in a stabilized state.

In process P320 of FIG. 11, a purge gas may be supplied onto the resultant structure in which the surface of the insulating pattern 226, which is treated to inhibit deposition, and the surface of the lower electrode LE2 are exposed, and thus, unnecessary byproducts on the substrate 210 may be removed. In this case, residue of the pre-processing gas remaining on the substrate 210 may be removed. For example, an inert gas, such as argon (Ar), helium (He), and neon (Ne), or nitrogen ($N_2$) gas may be used as the purge gas.

In process P330 of FIG. 11, a conductive interface layer 250 including a metal oxide film including at least one kind of metal element may be selectively formed only on a surface of the lower electrode LE2, from among the insulating pattern 226P and the lower electrode LE2.

In example embodiments, the metal element included in the conductive interface layer 250 may be a different material from a metal included in the lower electrode LE2. In other example embodiments, the metal element included in the conductive interface layer 250 may be the same material as the metal included in the lower electrode LE2.

In process P340 of FIG. 11, the conductive interface layer 250 may be densified by supplying a post-processing gas to the conductive interface layer 250.

While the conductive interface layer 250 is being densified by supplying the post-processing gas, impurities remaining on the substrate 210 or impurities remaining in the conductive interface layer 250 may be removed.

In example embodiments, the post-processing gas may include a different material from the pre-processing gas. For example, the post-processing gas may be selected from $H_2$, $N_2$, Ar, $O_2$, $O_3$, $H_2O$, $NH_3$, and a combination thereof. When the post-processing gas is supplied, a process temperature selected in a range of room temperature to about 500° C. may be maintained.

In process P350 of FIG. 11, a dielectric film 260 may be formed on the insulating pattern 226P and the conductive interface layer 250.

In process P360 of FIG. 11, an upper electrode UE2 may be formed on the dielectric film 260. In example embodiments, the metal element included in the conductive interface layer 250 may include a different material from a metal included in the upper electrode UE2. In other example embodiments, the metal element included in the conductive interface layer 250 may include the same material as the metal included in the upper electrode UE2.

Figure 12:
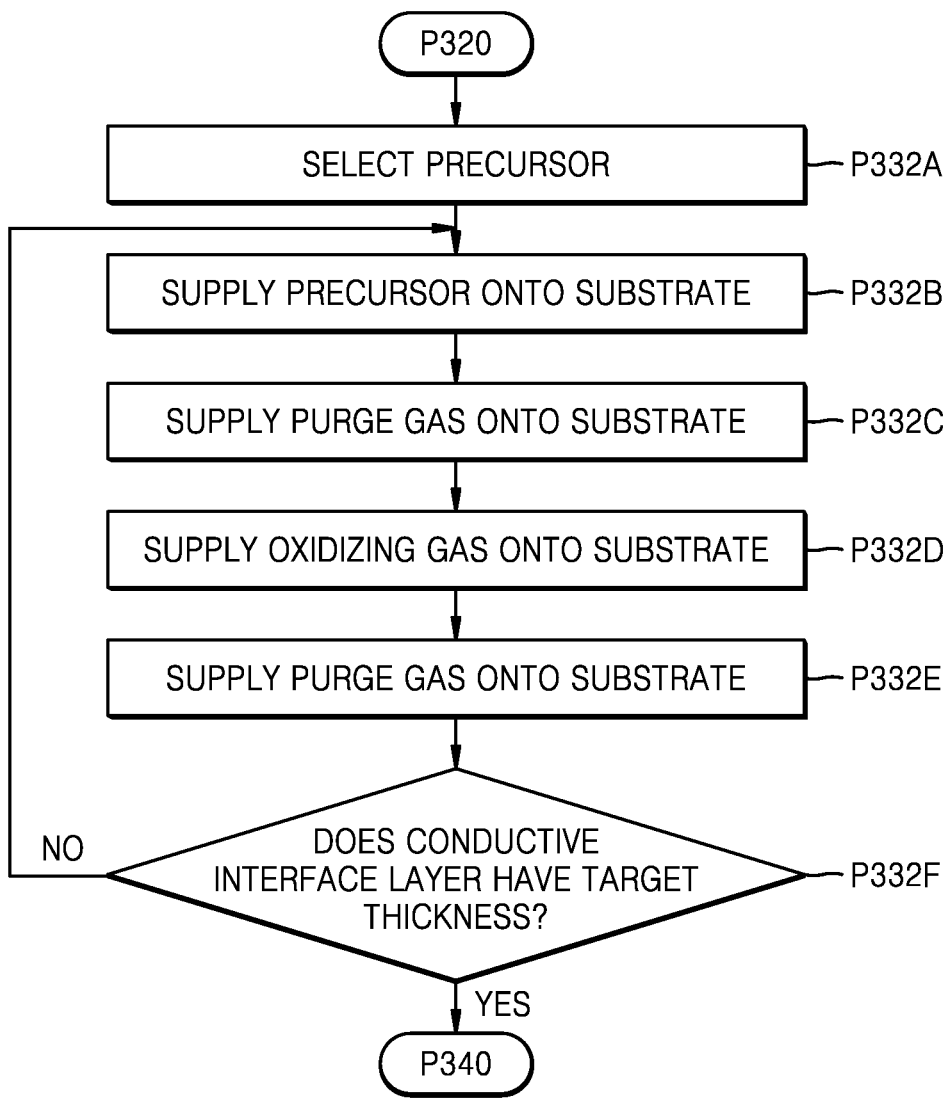
FIG. 12 is a flowchart of a method of forming a conductive interface layer based on process P330 of FIG. 11, according to an example embodiment.

FIG. 12 is a flowchart of a method of forming a conductive interface layer based on process P330 of FIG. 11, according to an example embodiment.

In process P332A of FIG. 12, a precursor used for forming the conductive interface layer may be selected.

The precursor may include at least one precursor compound including at least one metal element, which includes a typical metal, a transition metal, or a post-transition metal. In example embodiments, the precursor may include a central atom including at least one kind of metal element selected from aluminum (Al), zirconium (Zr), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), and bismuth (Bi) and at least one ligand bonded to the central atom. The ligand may include a C5-C12 cyclopentadienyl group, a C1-C10 saturated or unsaturated hydrocarbon group, a C1-C10 organic amine group, a C5-C20 β-diketonato group, a C5-C20β-ketoiminato group, a C5-C20 β-diiminato group, or a halogen element, without being limited thereto.

In example embodiments, the precursor may have a structure represented by Formula 2:

wherein M denotes a typical metal, a transition metal, or a post-transition metal, $L^1$ denotes a hydrogen atom, a halogen atom, a C1-C10 alkyl group, a C1-C10 alkoxy group, a C2-C10 alkenyl group, a C2-C10 alkynyl group, a C6-C12 aryl group, a C6-C15 arylalkyl group, a C3-C15 allyl group, a C3-C15 cycloalkyl group, a C3-C15 cycloalkenyl group, a C4-C15 dienyl group, a C1-C10 alkylamino group, an amido group, an imido group, a C1-C10 thiol group, a C5-C12 cyclopentadienyl group, an arene (η6-$C_6H_6$) group, or a C1-C10 thiyl group, $L^2$ denotes CO, $H_2O$, C1-C10 alkylamine, ether ketone, phosphine, thioether, or pyridine, m is an integer ranging from 2 to 8, and n is an integer ranging from 0 to 6. In Formula 2, $L^2$ may be a heteroatom (e.g., nitrogen (N), oxygen (O), phosphorous (P), and sulfur (S)) or a neutral ligand coordinately bonded to M through halide.

When the metal element is aluminum (Al), an aluminum precursor may include trimethyl aluminum, triethyl aluminum, trichloro aluminum($AlCl_3$) aluminum methoxide, aluminum ethoxide, aluminum aluminum nitrate nonahydrate, aluminum fluoride trihydrate, aluminum phosphate hydrate, aluminum aluminum chloride hexahydrate, aluminum hydroxide, aluminum sulfate hexadecahydrate, aluminum ammonium sulfate dodecahydrate, 1-ethyl-3-methylimidazolium chloride-aluminum chloride, alumatrane, aluminum 2-ethylhexanoate, aluminum 2,3-naphthalocyanine chloride, aluminum 2,9,16,23-tetrakis(phenylthio)-29H,31H phthalocyanine chloride, aluminum acetotartrate, aluminum acetylacetonate, aluminum calcium isopropoxide, aluminum dimethyl isopropoxide, or derivatives thereof, without being limited thereto.

When the metal element is zirconium (Zr), a zirconium precursor may include tetrakis(ethylmethylamino)zirconium (TEMAZ), tris(dimethylamino)cyclopentadienyl zirconium, $(C_5H_5)Zr[N(CH_3)_2]_3$, $Zr(i-OPr)_4$, $Zr(TMHD)(i-OPr)_3$, $Zr(TMHD)_2(i-OPr)_2$, $Zr(TMHD)_4$, $Zr(DMAE)_4$, $Zr(METHD)_4$, (here, i-OPr=isopropoxide; TMHD=2,2,6,6-tetramethyl-3,5-heptanedionate; DMAE=dimethylaminoethoxide; METHD=methoxyethoxytetramethylheptanedionate), or a derivative thereof, without being limited thereto. When the metal element is niobium (Nb), a niobium precursor may include niobium pentachloride ($NbCl_5$), niobiumpentafluoride ($NbF_5$), pentakisdimethylaminoniobium (PDMAN, $Nb(N(CH_3)_2)_5$), pentakisdiethylaminoniobium (PDEAN, $Nb(NEt_2)_5$), pentakis(methylethylamido)niobium (PMEAN, Nb(NMeEt)s), tert-butyliminotris(dimethylamino)niobium (TBTDMN, $tBuNNb(NMe_2)_3$), tert-butyliminotris(diethylamino)niobium (TBTDEN, $tBuNNb(NEt_2)_3$), tert-butyliminotris(methylethylamino)niobium (TBTMEN, $tBuNNb(N-MeEt)_3$), ethylimido-tris(dimethylamido) niobium((EtN)Nb $(NMe_2)_3$), ethylimido-tris(diethylamido)niobium ((EtN)Nb $(NEt_2)_3$), ethylimido-tris(ethylmethylamido)niobium ((EtN)Nb[N(Et)Me]$_3$), tert-amylimido-tris(dimethylamido) niobium (NBIMANB, $(tAmylN)Nb(NMe_2)_3$, tert-amylimido-tris(diethylamido)niobium (NBIEANB, $(tAmylN)Nb(NEt_2)_3$), tert-amylimido-tris(ethylmethylamido)niobium (NBIMANB, (tAmylN)Nb([N(Et)Me]$_3$), or a derivative thereof, without being limited thereto.

When the metal element is molybdenum (Mo), a molybdenum precursor may include $(CpR)_2Mo(NR')$ (here, each of R and R' is H or a C1-C10 alkyl group), or Mo halide, without being limited thereto.

When the metal element is ruthenium (Ru), a ruthenium precursor may include $(C_6H_8)Ru(CO_3)$, $(C_7H_{10})Ru(CO)_3$, (cymene)(1,3-cyclohexadiene)Ru(0)((cymene)(1,3-cyclohexadiene)Ru(0)), (cymene)(1,4-cyclohexadiene)Ru(0), (cymene)(1-methylcyclohexa-1,3-diene)Ru(0), (cymene)(2-methylcyclohexa-1,3-diene)Ru(0), (cymene)(3-methylcyclohexa-1,3-diene)Ru(0), (cymene)(4-methylcyclohexa-1,3-diene)Ru(0), (cymene)(5-methylcyclohexa-1,3-diene)Ru (0), (cymene)(6-methylcyclohexa-1,3-diene)Ru(0), (cymene)(1-methylcyclohexa-1,4-diene)Ru(0), (cymene)(2-methylcyclohexa-1,4-diene)Ru(0), (cymene)(3-methylcyclohexa-1,4-diene)Ru(0), (cymene)(4-methylcyclohexa-1,4-diene)Ru(0), (cymene)(5-methylcyclohexa-1,4-diene)Ru (0), (cymene)(6-methylcyclohexa-1,4-diene)Ru(0), (benzene)(1,3-cyclohexadiene)Ru(0), (toluene)(1,3-cyclohexadiene)Ru(0), (ethylbenzene)(1,3-cyclohexadiene)Ru (0), (1,2-xylene)(1,3-cyclohexadiene)Ru(0), (1,3-xylene)(1,3-cyclohexadiene)Ru(0), (1,4-xylene)(1,3-cyclohexadiene) Ru(0), (p-cymene)(1,3-cyclohexadiene)Ru(0), (o-cymene) (1,3-cyclohexadiene)Ru(0), (m-cymene)(1,3-cyclohexadiene)Ru(0), (cumene)(1,3-cyclohexadiene)Ru (0), (n-propylbenzene)(1,3-cyclohexadiene)Ru(0), (m-ethyltoluene)(1,3-cyclohexadiene)Ru(0), (p-ethyltoluene)(1,3-cyclohexadiene)Ru(0), (o-ethyltoluene)(1,3-cyclohexadiene)Ru(0), (1,3,5-trimethylbenzene)(1,3-cyclohexadiene)Ru(0), (1,2,3-trimethylbenzene)(1,3-cyclohexadiene) Ru(0), (tert-butylbenzene)(1,3-cyclohexadiene)Ru(0), (isobutylbenzene)(1,3-cyclohexadiene)Ru(0), (sec-butylbenzene)(1,3-cyclohexadiene)Ru(0), (indan)(1,3-cyclohexadiene)Ru(0), (1,2-diethylbenzene)(1,3-cyclohexadiene) Ru(0), (1,3-diethylbenzene)(1,3-cyclohexadiene)Ru(0), (1,4-diethylbenzene)(1,3-cyclohexadiene)Ru(0), (1-methyl-4-propylbenzene)(1,3-cyclohexadiene)Ru(0), (1,4-dimethyl-2-ethylbenzene)(1,3-cyclohexadiene)Ru(0), or a derivative thereof, without being limited thereto.

When the metal element is indium (In), an indium precursor may include indium acetate ($In(CH_3COO)_3$), indium trichloride ($InCl_3$), indium tribromide ($InBr_3$), indium nitrate ($In(NO_3)_3$), indium sulfate ($In_2(SO_4)_3$), indium hydroxide ($In(OH)_3$), or a derivative thereof, without being limited thereto.

When the metal element is tin (Sn), a tin precursor may include $R_2Sn(NR'R'')_2$ (here, each of R, R', and R" is H or a C1-C10 alkyl group), Sn halide, or a derivative thereof, without being limited thereto.

When the metal element is antimony (Sb), an antimony precursor may include $SbCl_3$, $SbBr_3$, $SbI_3$, $Sb(OC_2H_5)_3$, $Sb(OC_3H_7)_3$, $Sb(OC_4H_9)_3$, or a derivative thereof, without being limited thereto.

When the metal element is scandium (Sc), a scandium precursor may include $Sc(MeCp)_2(Me_2pz)$ (MeCp=methylcyclopentadienyl, $Me_2pz$=3,5-dimethylpyrazolate), $Cp_3Sc$, $Sc(THD)_3$ (THD=2,2,6,6-tetramethyl-3,4-heptanedionato), $Sc(i-OPr)_3$ (i-OPr=isopropoxide), or a derivative thereof, without being limited thereto. When the metal element is titanium (Ti), a titanium precursor may include titaniumtetrachloride ($TiCl_4$), titaniumtetrafluoride ($TiF_4$), titanium tetrakis(isopropoxide) ($Ti(O-iPr)_4$), cyclopentadienyl titanium, titanium bis(isopropoxide)bis(2,2,6,6-tetramethyl-3,5-heptane dionate) ($Ti(O-iPr)_2(thd)_2$), tetrakisdimethylaminotitanium (TDMAT, $Ti(NMe_2)_4$), tetrakis (diethylamino)titanium (TEMAT, $(Et_2N)_4Ti$), trimethoxy (pentamethylcyclopentadienyl)titanium (($Cp^*$)Ti(OMe)$_3$), or a derivative thereof, without being limited thereto.

When the metal element is vanadium (V), a vanadium precursor may include vanadiumtetrachloride ($VCl_4$), vanadiumpentachloride ($VCl_5$), vanadiumpentafluoride (VFs), tetrakisdimethylaminovanadium (TDMAV, $V(N(CH_3)_2)_4$), tetrakisdiethylaminovanadium (TDEAV, $V(NEt_2)_4$), tetrakis (methylethylamido)vanadium (TMEAV, $V(NMeEt)_4$), bis (cyclopentadienyl)vanadium ($Cp_2V$), bis(cyclopentadienyl) dichlorovanadium ($Cp_2VCl_2$), or a derivative thereof, without being limited thereto.

When the metal element is manganese (Mn), a manganese precursor may include $Mn(thd)_3$, (thd=2,2,6,6-tetramethyl-3,5-heptanedionate), manganese oxalate, $MnCp_2$, Mn(Me$_4$Cp)$_2$, Mn(EtCp)$_2$), Mn(btsa)$_2$ (btsa=bis(trimethylsilyl)amide), bis(amideaminoalkane)manganese, or a derivative thereof, without being limited thereto.

When the metal element is iron (Fe), an iron precursor may include FeCl$_3$, Fe(NO$_3$)$_3$, Fe(CO)$_5$, Fe(NO$_3$)$_2$, Fe(SO$_4$)$_3$, Fe(acac)$_3$ (iron (III) acetyl acetonate), or a derivative thereof, without being limited thereto.

When the metal element is cobalt (Co), a cobalt precursor may include di-cobalt octacarbonyl, cobalt nitrosyl complexes, β-diketonates of cobalt (II) and cobalt (III), or a derivative thereof, without being limited thereto.

When the metal element is nickel (Ni), a nickel precursor may include NiSO$_4$.6H$_2$O, NiCl$_2$.6H$_2$O, Ni(EtCp)$_2$, Ni(CO)$_4$, Ni(MeCp)$_2$, Ni(EtCp)$_2$, bis(i-propylcyclopentadienyl) nickel (Ni(iPrCp)$_2$), bis[1-dimethylamino-2-methyl-2-butoxy]Ni(II) (bis[1-dimethylamino-2-methyl-2-butoxy]Ni (II)), or a derivative thereof, without being limited thereto.

When the metal element is arsenic (As), an arsenic precursor may include As(OCH$_3$)$_3$, As(OC$_2$H$_5$)$_3$, As(OC$_3$H$_7$)$_3$, As(OC$_4$H$_9$)$_3$, or a derivative thereof, without being limited thereto.

When the metal element is tantalum (Ta), a tantalum precursor may include tantalum pentachloride (TaCl$_5$), tantalumpentafluoride (TaF$_5$), pentakisdimethylaminotantalum (TADMA, Ta(NMe$_2$)$_5$), pentakisdiethylaminotantalum (PDEAT, Ta(NEt$_2$)$_5$), pentakis(methylethylamido)tantalum (PMEAT, Ta(NMeEt)$_5$), tert-butyliminotris(dimethylamino) tantalum (TBTDMT, tBuNTa(NMe$_2$)$_3$), tert-butyliminotris (diethylamino)tantalum (TBTDET, tBuNTa(NEt$_2$)$_3$), tert-butyliminotris(methylethylamino)tantalum (TBTMET, tBuNTa(NMeEt)$_3$), ethylimido-tris(dimethylamido)tantalum ((EtN)Ta(NMe$_2$)$_3$), ethylimido-tris(diethylamido)tantalum ((EtN)Ta(NEt$_2$)$_3$), ethylimido-tris(ethylmethylamido) tantalum ((EtN)Ta[N(Et)Me]$_3$), tert-amylimido-tris (dimethylamido)tantalum (TAIMATA, (tAmylN)Ta(NMe$_2$)$_3$), tert-amylimido-tris(diethylamido)tantalum (TAIEATA, (tAmylN)Ta(NEt$_2$)$_3$), tert-amylimido-tris(ethylmethylamido)tantalum (TAIMATA, (tAmylN)Ta([N(Et)Me]$_3$), or a derivative thereof, without being limited thereto.

When the metal element is tungsten (W), a tungsten precursor may include bis(tert-butylimido) bis(tert-butylamido)tungsten((tBuN)$_2$ W(N(H)tBu)$_2$), bis(tert-butylimido) bis(dimethylamido)tungsten((tBuN)$_2$ W(NMe$_2$)$_2$), bis(tert-butylimido) bis(diethylamido)tungsten((tBuN)$_2$ W(NEt$_2$)$_2$), bis(tert-butylimido) bis(ethylmethylamido) tungsten((tBuN)$_2$ W(NEtMe)$_2$), tungsten hexafluoride, tungsten hexachloride, or a derivative thereof, without being limited thereto.

When the metal element is iridium (Ir), an iridium precursor may include iridium acetylacetonate, iridium nitrate, iridium chloride, iridium sulfate, iridium acetate, iridium acetylacetonate, iridium cyanate, iridium isopropyl oxide, iridium butoxide, H$_2$IrCl$_6$.6H$_2$O, or a derivative thereof, without being limited thereto.

When the metal element is yttrium, a yttrium precursor may include yttrium chloride, yttrium nitrate, yttrium acetyl acetonate hydrate, yttrium fluoride, yttrium acetate, yttrium sulfate, Y(thd)$_3$, Y(CH$_3$Cp)$_3$, or a derivative thereof, without being limited thereto.

When the metal element is bismuth (Bi), a bismuth precursor may include tris(1-methoxy-2-methyl-2-propxy) bismuth (Bi(MMP)$_3$), Bi(phen)$_3$, (here, phen=phenyl), BiCl$_3$, or a derivative thereof, without being limited thereto. The precursor including the metal element is not limited to the examples described above and may be selected from known precursors. In example embodiments, the precursor including the metal element may be a liquid at room temperature.

In process P332B of FIG. 12, the precursor may be supplied onto the substrate 210.

In example embodiments, the precursor including the metal element may be supplied onto the substrate 210 while maintaining a process temperature of about 100° C. to about 600° C.

In example embodiments, a process pressure may be maintained in a range of about 10 Pa to an atmospheric pressure during a deposition process for forming the conductive interface layer according to the method described with reference to FIG. 12. In example embodiments, to form the conductive interface layer, a precursor including the metal element may be supplied alone onto the substrate 210. In other example embodiments, to form the conductive interface layer, a multi-component source including a mixture of the precursor including the metal element and at least one of a precursor including a metal element different from the metal element described above, a reactive gas, and an organic solvent may be supplied onto the substrate 210. A time period for which supply gases described above are supplied once into a reaction space may be maintained for about 0.1 seconds to about 100 seconds. The precursor and the reactive gas may be simultaneously or sequentially supplied onto the substrate 210.

By supplying the precursor onto the substrate 210 based on process P332B of FIG. 12, a chemisorbed layer and a physisorbed layer of the precursor may be formed on a surface of the lower electrode LE2.

In process P332C of FIG. 12, unnecessary by-products remaining on the substrate 210 may be removed by supplying a purge gas onto the substrate 210. In this case, the physisorbed layer of the precursor remaining on the substrate 210 may be removed. For example, an inert gas, such as Ar, He, and Ne, or N$_2$ gas may be used as the purge gas.

In process P332D of FIG. 12, an oxidizing gas may be supplied onto the substrate 210. As a result, a monoatomic level of a metal oxide film may be formed from the chemisorbed layer of the precursor formed in process P332B. Specific examples of the metal oxide film may be the same as those of the metal oxide film included in the conductive interface layer 150, which have been described with reference to FIG. 1.

The oxidizing gas may be selected from O$_2$, O$_3$, H$_2$O, NO$_2$, NO, nitrous oxide (N$_2$O), CO, CO$_2$, H$_2$O$_2$, HCOOH, CH$_3$COOH, (CH$_3$CO)$_{20}$, alcohol, peroxide, sulfur oxide, plasma O$_2$, remote plasma O$_2$, plasma N$_2$O, plasma H$_2$O, and a combination thereof.

In process P332E of FIG. 12, unnecessary by-products remaining on the substrate 210 may be removed by supplying a purge gas onto the substrate 210. In this case, residue of the oxidizing gas remaining on the substrate 210 may be removed. For example, an inert gas, such as Ar, He, and Ne, or N$_2$ gas may be used as a purge gas.

In process P332F of FIG. 12, it may be determined whether the conductive interface layer has been formed to a target thickness, and a deposition cycle including processes P332B to P332E may be repeated multiple times until a thickness of the conductive interface layer reaches the target thickness. When it is determined in process P332F that the conductive interface layer has the target thickness, the method may proceed to process P340 of FIG. 11.

In example embodiments, the conductive interface layer 250 shown in FIG. 7B or the conductive interface layer 250A shown in FIG. 8 may be formed using the method described with reference to FIG. 12.

Figure 13A:
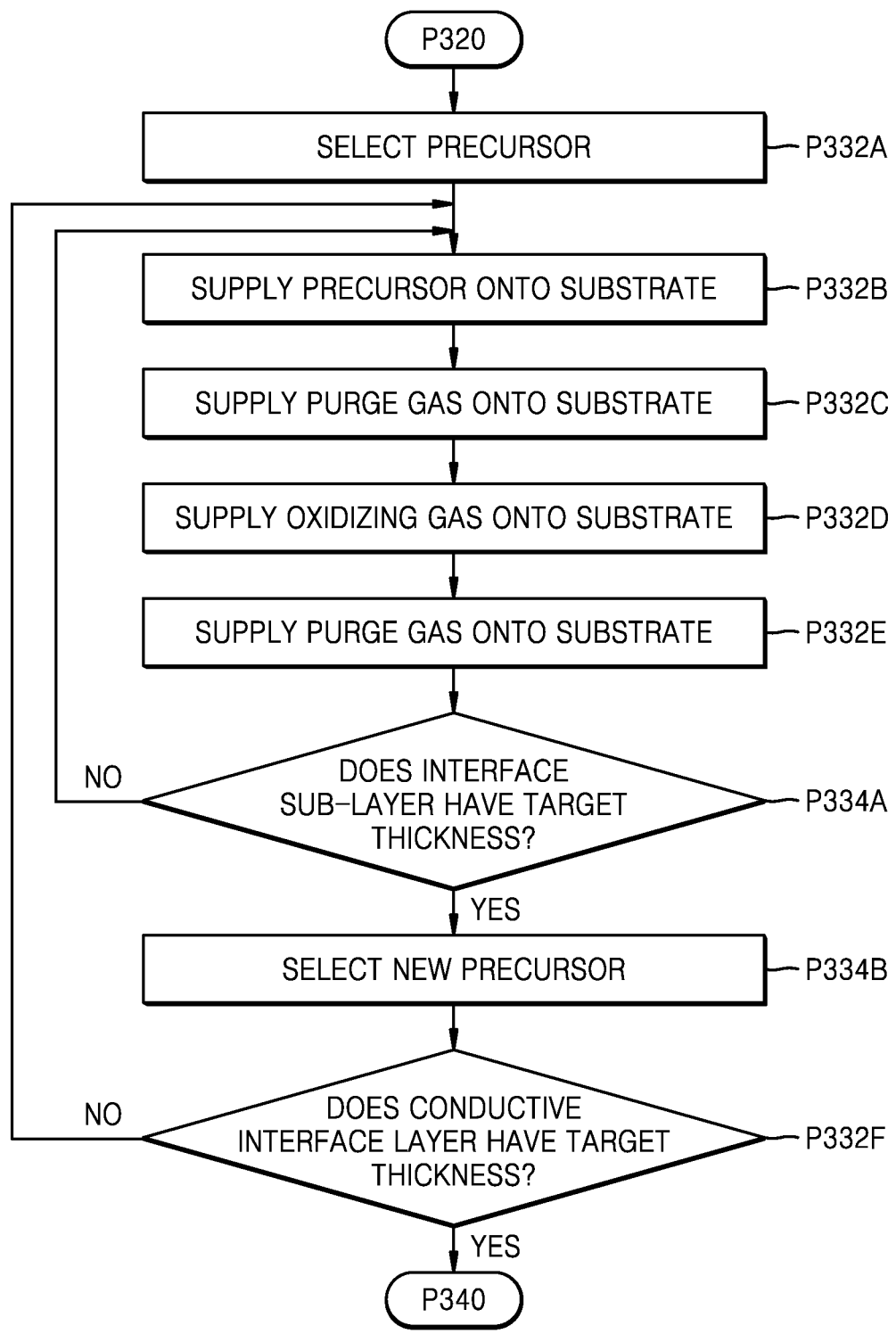
FIGS. 13A to 13D are flowcharts of methods of forming a conductive interface layer based on process P330 of FIG. 11, according to example embodiments.

FIG. 13A is a flowchart of a method of forming a conductive interface layer based on process P330 of FIG. 11, according to an example embodiment.

Processes P332A to P332E of FIG. 13A may be performed using the method described with reference to FIG. 12, and thus, a conductive interface sub-layer including a first metal element may be formed.

In process P334A of FIG. 13A, it may be determined whether the conductive interface sub-layer has been formed to a target thickness, and a deposition cycle including processes P332B to P332E may be repeated plural times until a thickness of the conductive interface sub-layer reaches the target thickness.

When it is determined in process P334A that the conductive interface sub-layer is formed to the target thickness, a new precursor may be selected in process P334B. The new precursor may be different from the previous precursor. The new precursor may have a structure substantially similar to that of the precursor selected/used in process P332A of FIG. 12. However, the new precursor may include a metal element of a different kind from a metal element included in the previous precursor.

In process P332F of FIG. 13A, it may be determined whether a final conductive interface layer to be formed has been formed to the target thickness. When the final conductive interface layer does not have the target thickness, the deposition cycle including processes P332B to P334B of FIG. 13A may be repeated multiple times by using the new precursor, and thus, a new conductive interface sub-layer may be formed on the previously formed conductive interface sub-layer.

In process P332F of FIG. 13A, the deposition cycle including processes P332B to P334B of FIG. 13A may be repeated multiple times until it is determined that the final conductive interface layer has the target thickness. When it is determined in process P332F that the final conductive interface layer has the target thickness, the method may proceed to process P340 of FIG. 11.

In example embodiments, the conductive interface layer 250B shown in FIG. 9, the conductive interface layer 250C shown in FIG. 10, or the conductive interface layer 150D shown in FIG. 5 may be formed using the method described with reference to FIG. 13A.

Figure 13B:
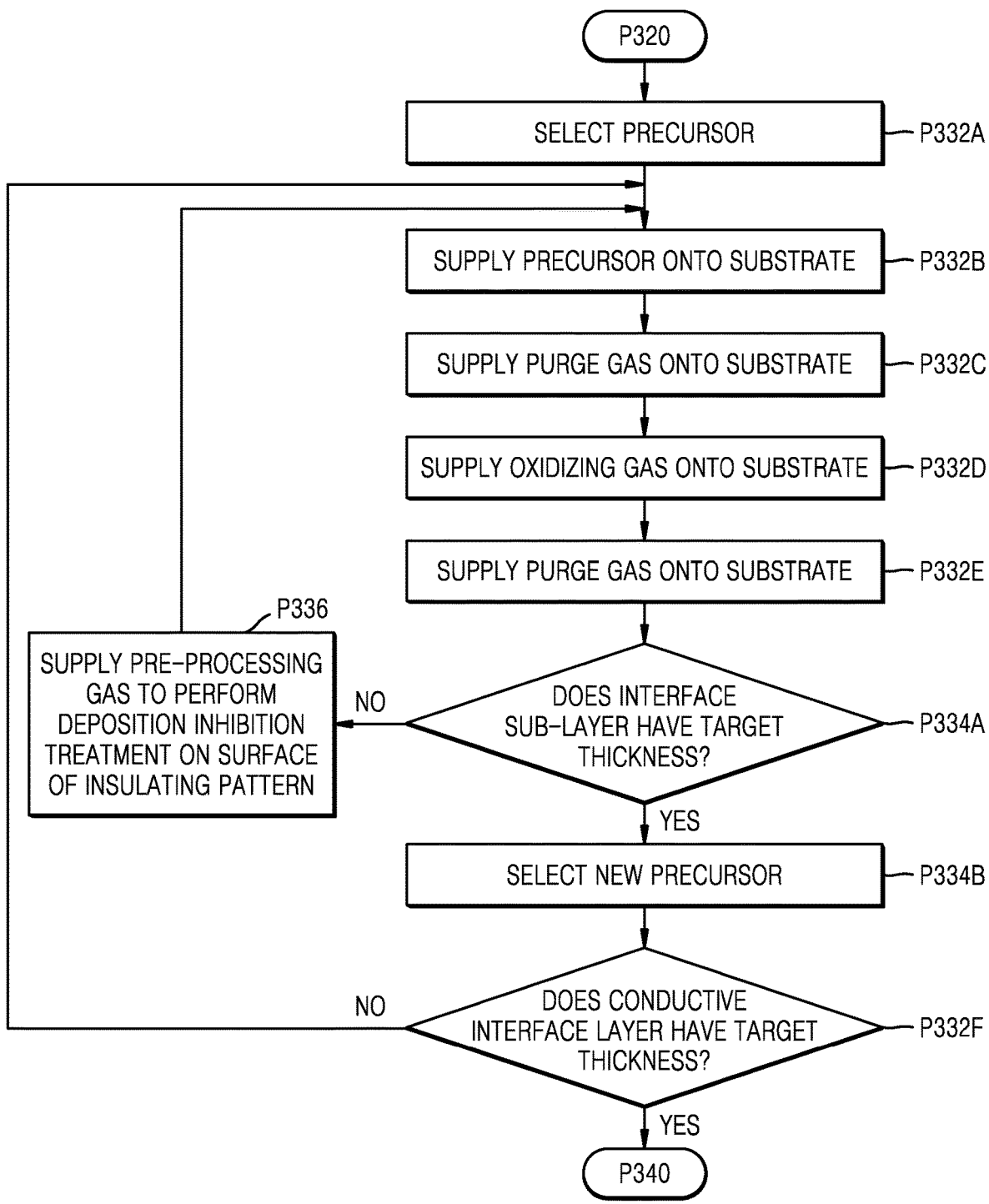

FIG. 13B is a flowchart of a method of forming a conductive interface layer based on process P330 of FIG. 11, according to an example embodiment.

A process of forming the conductive interface layer, which is shown in FIG. 13B, may be substantially the same as that described with reference to FIG. 13A. However, in the process of forming the conductive interface layer, which is shown in FIG. 13B, when it is determined in process P334A that a conductive interface sub-layer has not been formed to a target thickness, before a deposition cycle including processes P332B to P332E is repeated again, a process of selectively performing a deposition inhibition treatment on a surface of the insulating pattern 226P by supplying a pre-processing gas onto the substrate 210 may be further performed in process P336. By further performing the process of supplying the pre-processing gas according to process P336, when a precursor is supplied onto the substrate 210 in process P332B, the selective deposition of the precursor only on a surface of the lower electrode LE2, from among the insulating pattern 226P and the lower electrode LE2, may be further reinforced.

In example embodiments, the conductive interface layer 250B shown in FIG. 9, the conductive interface layer 250C shown in FIG. 10, or the conductive interface layer 150D shown in FIG. 5 may be formed using the method described with reference to FIG. 13B.

Figure 13C:
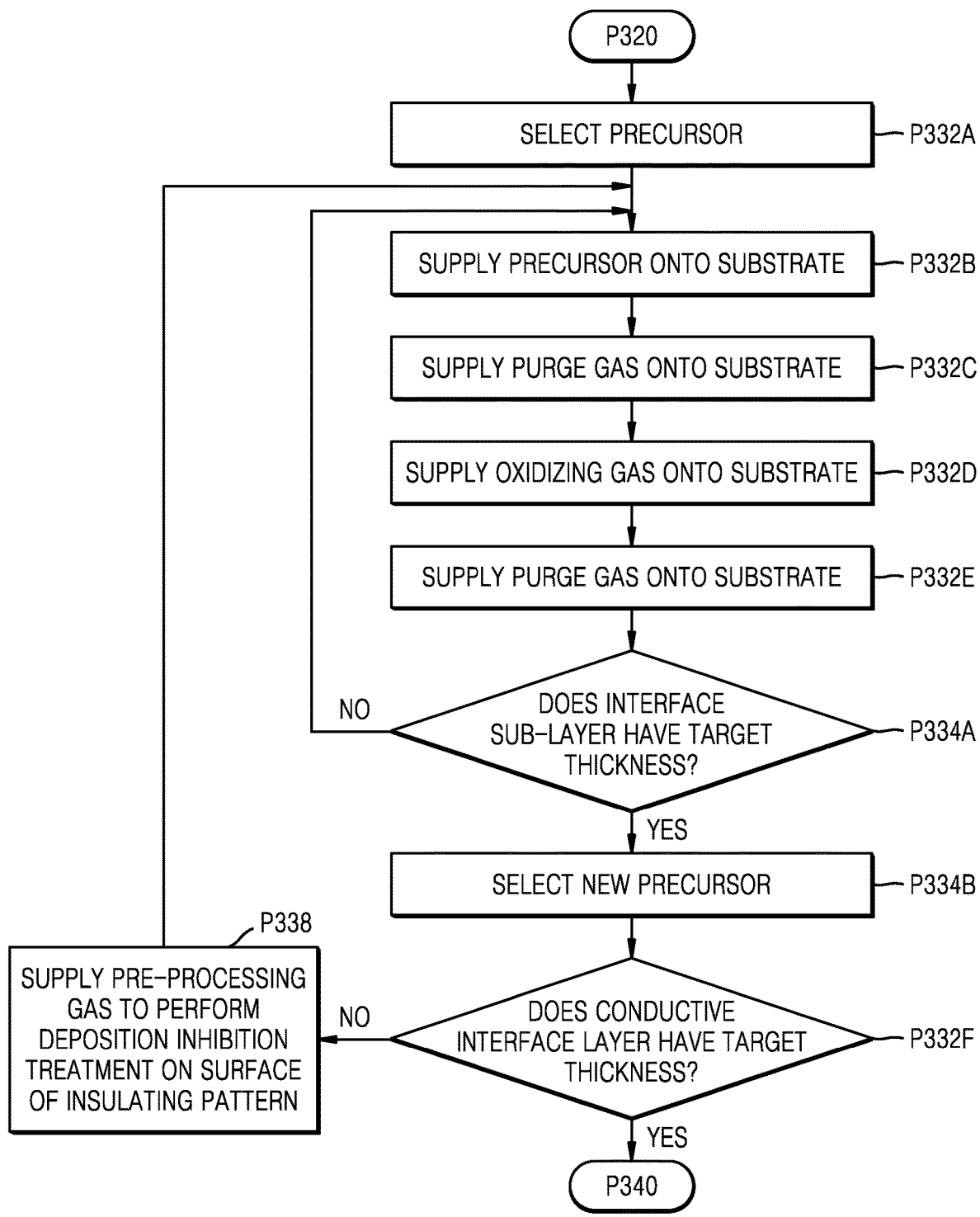

FIG. 13C is a flowchart of a method of forming a conductive interface layer based on process P330 of FIG. 11, according to an example embodiment.

A process of forming the conductive interface layer, which is shown in FIG. 13C, may be substantially the same as that described with reference to FIG. 13A. However, in the process of forming the conductive interface layer, which is shown in FIG. 13C, after one interface sub-layer is formed by performing processes P332A to P334A at least once, when it is determined in process P332F that a final conductive interface layer has not been formed to a target thickness, before a deposition cycle including processes P332B to P332E is repeated again to form a new interface sub-layer on the one interface sub-layer, a process of selectively performing a deposition inhibition treatment on a surface of the insulating pattern 226P by supplying a pre-processing gas onto the substrate 210 may be further performed in process P338. By further performing the process of supplying the pre-processing gas according to process P338, when a new precursor is supplied onto the substrate 210 in process P332B, the selective deposition of the new precursor only on a surface of a previously formed interface sub-layer, from among the insulating pattern 226P and the previously formed interface sub-layer, may be further reinforced.

In example embodiments, the conductive interface layer 250B shown in FIG. 9, the conductive interface layer 250C shown in FIG. 10, or the conductive interface layer 150D shown in FIG. 5 may be formed by using the method described with reference to FIG. 13C.

Figure 13D:
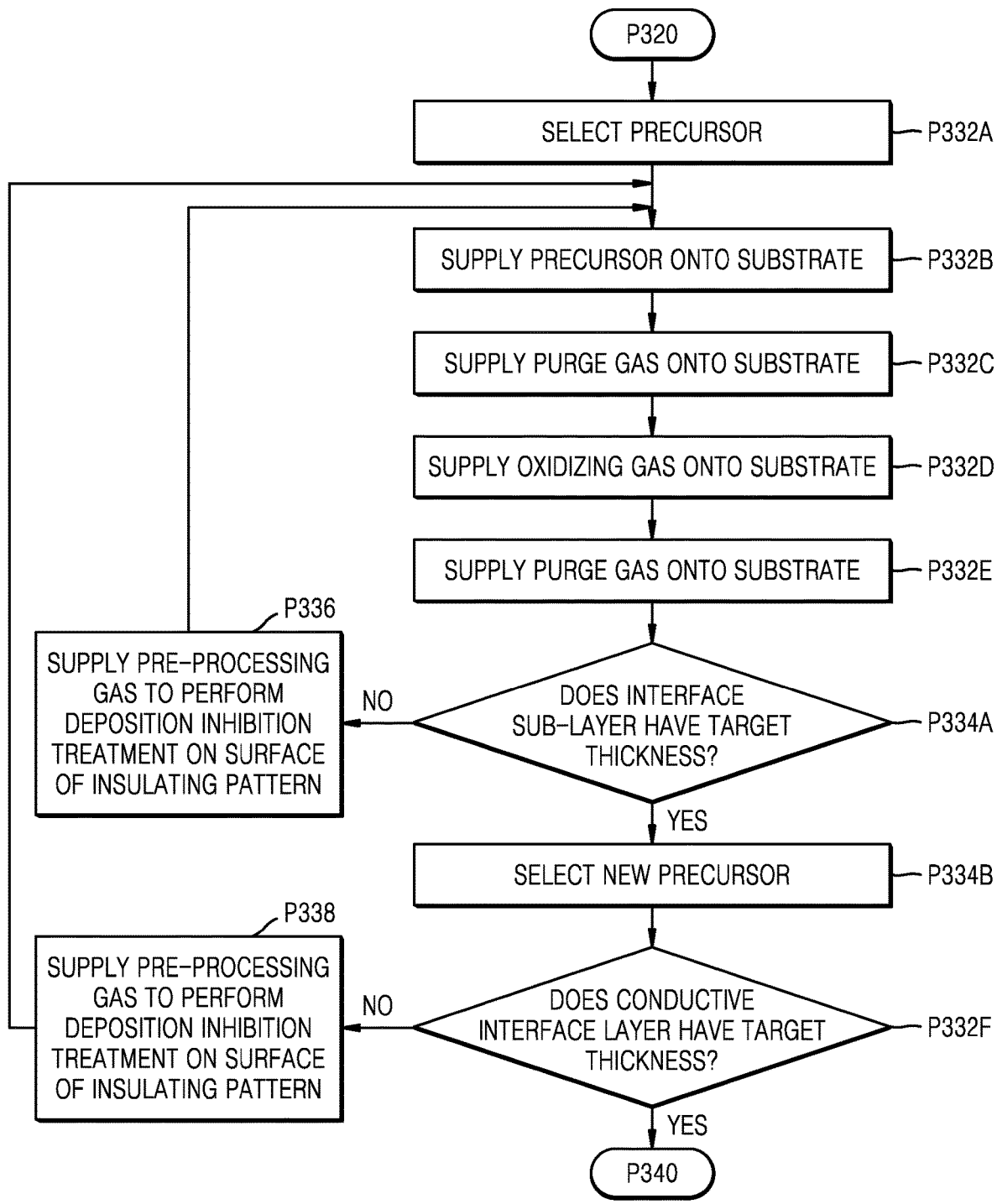

FIG. 13D is a flowchart of a method of forming a conductive interface layer based on process P330 of FIG. 11, according to an example embodiment.

A process of forming the conductive interface layer, which is shown in FIG. 13D, may be substantially the same as that described with reference to FIG. 13B. However, in the process of forming the conductive interface layer, which is shown in FIG. 13D, after one interface sub-layer is formed by performing processes P332A to P334A at least once, when it is determined in process P332F that a final conductive interface layer has not been formed to a target thickness, before a deposition cycle including processes P332B to P332E is repeated again to form a new interface sub-layer on the one interface sub-layer, a process of selectively performing a deposition inhibition treatment on a surface of the insulating pattern 226P by supplying a pre-processing gas onto the substrate 210 may be further performed in process P338 by using the same method as that described with reference to FIG. 13C.

In example embodiments, the conductive interface layer 250B shown in FIG. 9, the conductive interface layer 250C shown in FIG. 10, or the conductive interface layer 150D shown in FIG. 5 may be formed using the method described with reference to FIG. 13D.

FIGS. 14A to 14G are cross-sectional views of a process sequence of a method of manufacturing an IC device, according to embodiments. In FIGS. 14A to 14G, the same reference numerals are used to denote the same elements as in FIGS. 7A to 7D, and detailed descriptions thereof are omitted.

Figure 14A:
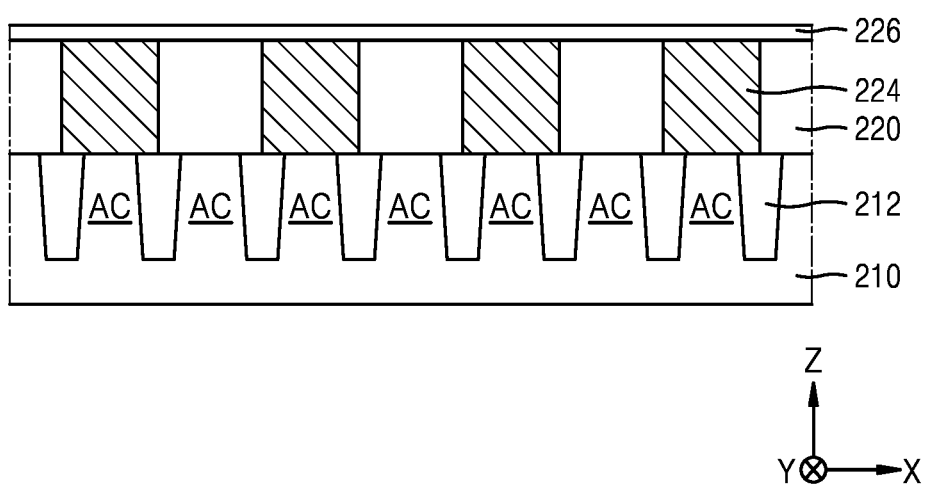
FIGS. 14A to 14G are cross-sectional views of a process sequence of a method of manufacturing an IC device, according to embodiments.

Referring to FIG. 14A, a lower structure 220 and a conductive region 224 may be formed on a substrate 210 in which an active region AC is defined by the device isolation film 212. The conductive region 224 may pass through the lower structure 220 and be connected to the active region AC. Thereafter, an insulating film 226 may be formed on (e.g., to cover) the lower structure 220 and the conductive region 224.

The insulating film 226 may be used as an etch stop layer during a subsequent process. The insulating film 226 may include an insulating material having an etch selectivity with respect to the lower structure 220. In some embodiments, the insulating film 226 may include a silicon nitride film (SiN), a silicon carbon nitride film (SiCN), a silicon boron nitride film (SiBN), or a combination thereof.

Figure 14B:
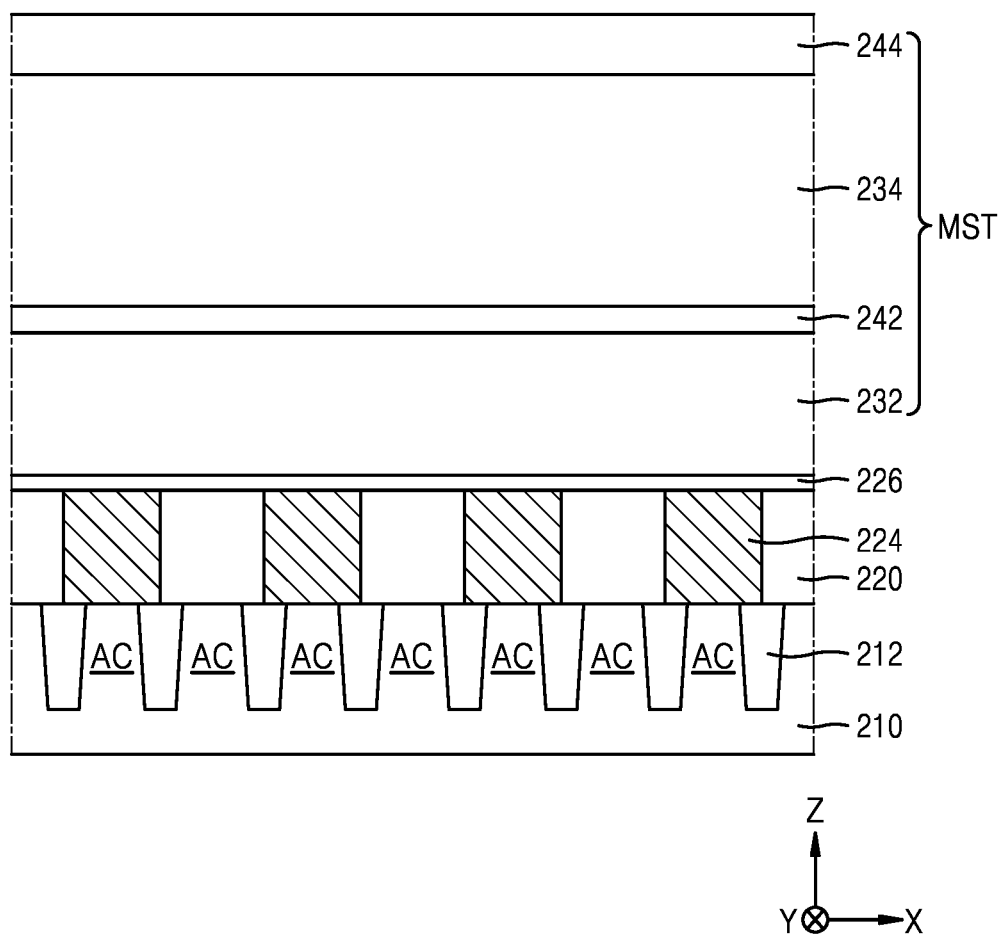

Referring to FIG. 14B, a mold structure MST may be formed on the insulating film 226.

The mold structure MST may include a plurality of mold films and a plurality of support films. For example, the mold structure MST may include a first mold film 232, a lower insulating support film 242, a second mold film 234, and an upper insulating support film 244, which are sequentially stacked on the insulating film 226. Each of the first mold film 232 and the second mold film 234 may include a material, which has a relatively high etch rate with respect to an etchant including ammonium fluoride ($NH_4F$), hydrofluoric acid (HF), and water and may be removed by a lift-off process using the etchant. In some embodiments, each of the first mold film 232 and the second mold film 234 may include an oxide film, a nitride film, or a combination thereof. For example, the first mold film 232 may include a boro phospho silicate glass (BPSG) film. The BPSG film may include at least one of a first portion in which the concentration of a dopant B (boron) varies in a thickness direction of the BPSG film and a second portion in which the concentration of a dopant P (phosphorus) varies in the thickness direction of the BPSG film. The second mold film 234 may include a silicon nitride film or a multilayered insulating film in which a silicon oxide film and a silicon nitride film, each of which has a relatively small thickness, are alternately and repeatedly stacked one by one plural times. However, a constituent material of each of the first mold film 232 and the second mold film 234 is not limited to the examples described above and may be variously modified and changed within the scope of the inventive concept. In addition, the order of stacking of films in the mold structure MST is not limited to the example shown in FIG. 14B and may be variously modified and changed within the scope of the inventive concept.

Each of the lower insulating support film 242 and the upper insulating support film 244 may include a silicon nitride film (SiN), a silicon carbon nitride film (SiCN), a silicon boron nitride film (SiBN), or a combination thereof. In example embodiments, the lower insulating support film 242 and the upper insulating support film 244 may include the same material. In other example embodiments, the lower insulating support film 242 and the upper insulating support film 244 may include different materials, respectively. In an example, each of the lower insulating support film 242 and the upper insulating support film 244 may include a silicon carbon nitride film. In another example, the lower insulating support film 242 may include a silicon carbon nitride film, and the upper insulating support film 244 may include a boron-containing silicon nitride film. However, constituent materials of the lower insulating support film 242 and the upper insulating support film 244 are not limited thereto and may be variously modified and changed within the scope of the inventive concept.

Figure 14C:
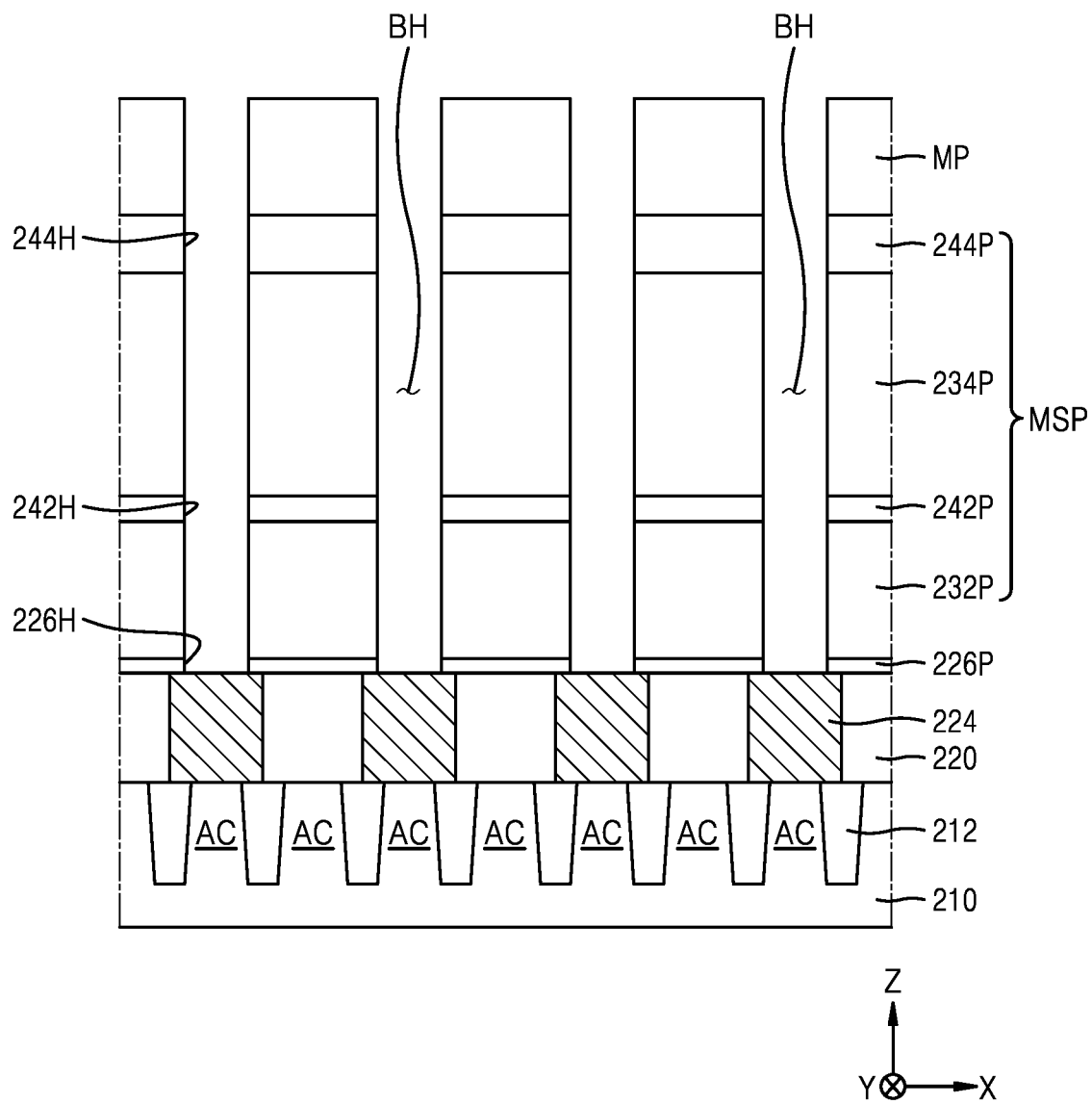

Referring to FIG. 14C, a mask pattern MP may be formed on the mold structure MST in the resultant structure of FIG. 14B. Thereafter, the mold structure MST may be anisotropically etched by using the mask pattern MP as an etch mask and by using the insulating film 226 as an etch stop layer to form a mold structure pattern MSP defining a plurality of holes BH. The mold structure pattern MSP may include a first mold pattern 232P, a lower insulating support pattern 242P, a second mold pattern 234P, and an upper insulating support pattern 244P.

The mask pattern MP may include a nitride film, an oxide film, a polysilicon film, a photoresist film, or a combination thereof.

The process of forming the plurality of holes BH may further include wet processing the resultant structure obtained by anisotropically etching the mold structure MST. During the process of wet processing the resultant structure obtained by anisotropically etching the mold structure MST, portions of the insulating film 226 may be etched together, and thus, an insulating pattern 226P having a plurality of openings 226H exposing the plurality of conductive regions 224 may be obtained. An example process for wet processing the resultant structure obtained by anisotropically etching the mold structure MST may be performed using an etchant including a diluted sulfuric acid peroxide (DSP) solution, without being limited thereto.

In the mold structure pattern MSP, a plurality of holes 242H, which are portions of the plurality of holes BH, may be formed in the lower insulating support pattern 242P, and a plurality of holes 244H, which are portions of the plurality of holes BH, may be formed in the upper insulating support pattern 244P.

Figure 14D:
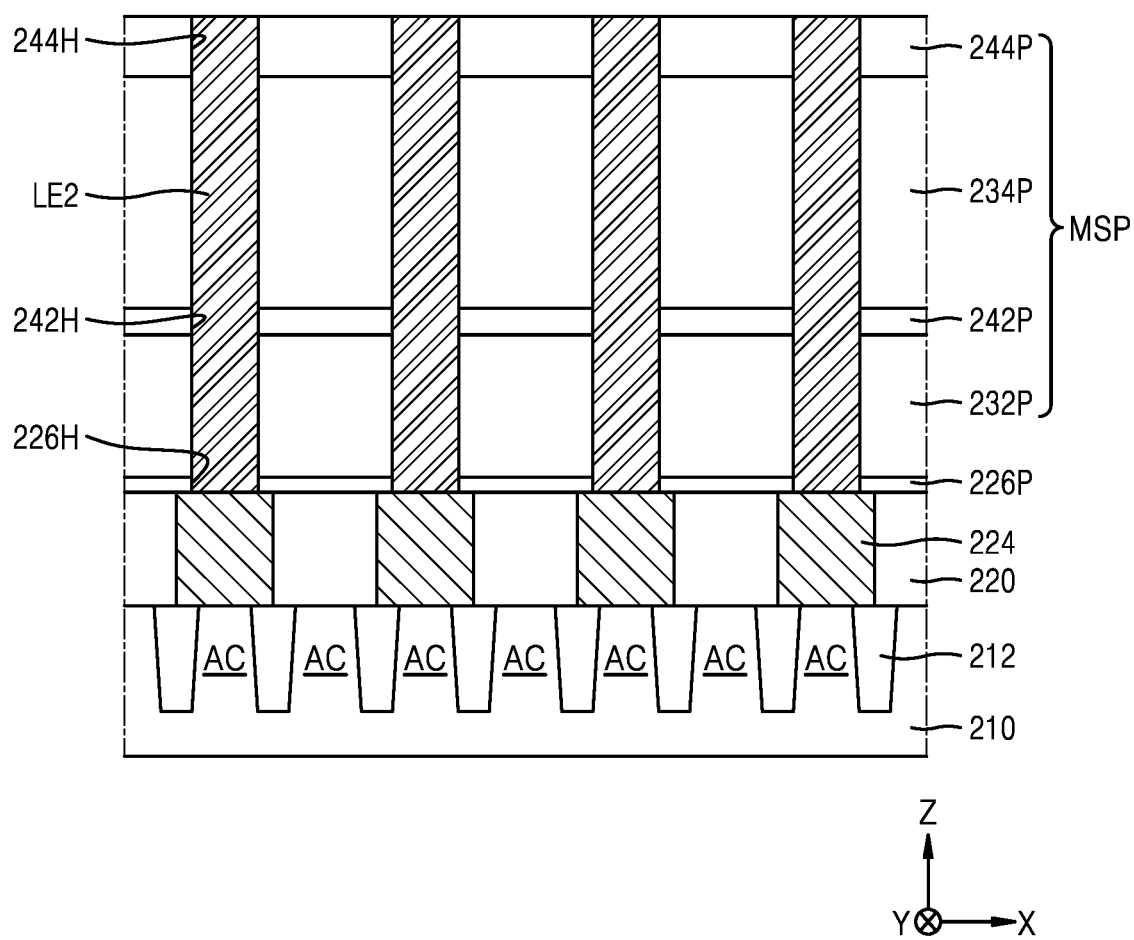

Referring to FIG. 14D, the mask pattern MP may be removed from the resultant structure of FIG. 14C, and the lower electrode LE2 may be formed to fill the plurality of holes BH.

In example embodiments, to form the lower electrode LE2, a conductive layer may be formed on the resultant structure of FIG. 14D to fill the plurality of holes BH and cover a top surface of the upper insulating support pattern 244P. To form the conductive layer, a chemical vapor deposition (CVD) process, a plasma-enhanced CVD (PECVD) process, a metal organic CVD (MOCVD) process, or an atomic layer deposition (ALD) process may be used. Thereafter, the conductive layer may be partially removed using an etchback process or a chemical mechanical polishing (CMP) process to expose the top surface of the upper insulating support pattern 244P.

Figure 14E:
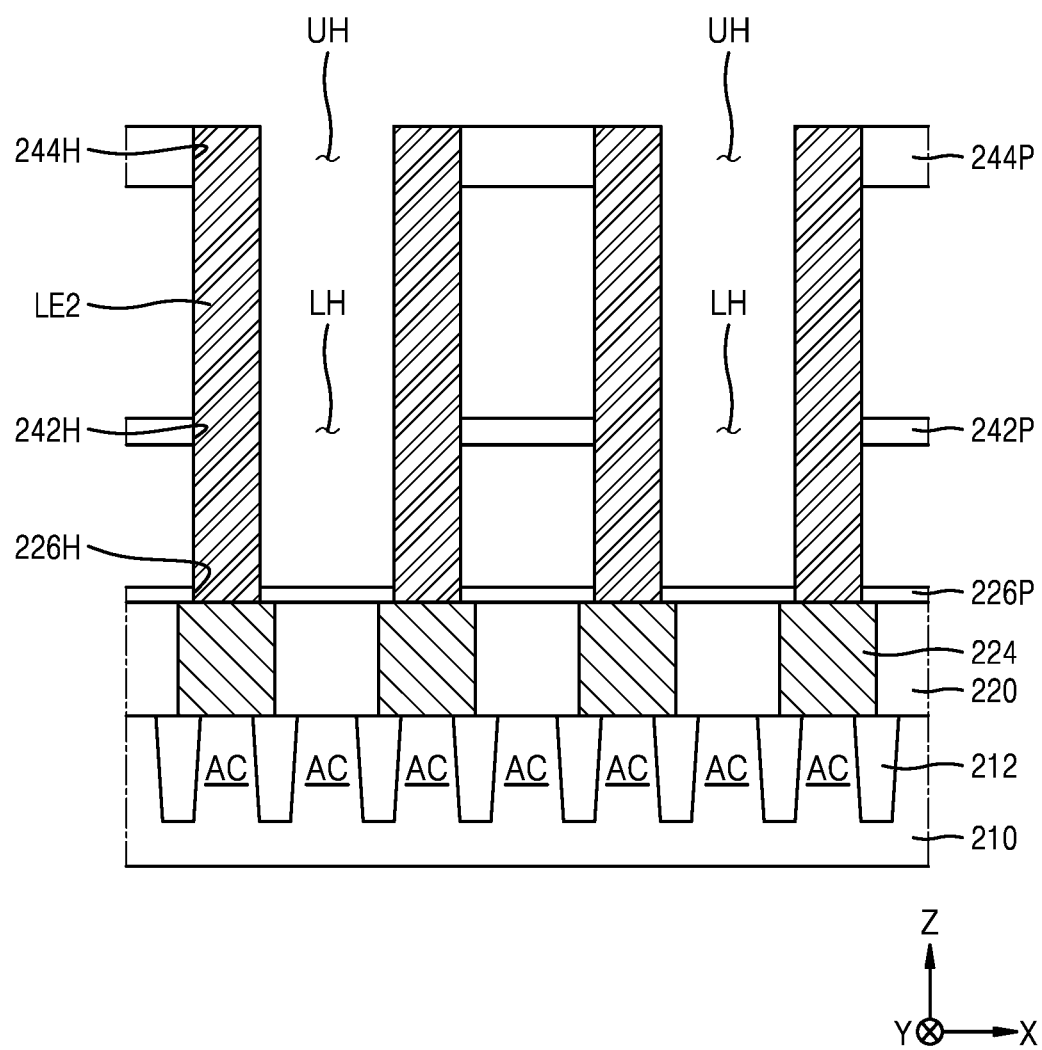

Referring to FIG. 14E, portions of the upper insulating support pattern 244P may be removed from the resultant structure of FIG. 14D to form a plurality of upper holes UH. Thereafter, the second mold pattern 234P may be wet etched/removed through the plurality of upper holes UH. Next, portions of the lower insulating support pattern 242P, which are exposed through the plurality of upper holes UH, may be removed to form a plurality of lower holes LH. Thereafter, the first mold pattern 232P may be wet etched/removed through the plurality of lower holes LH to expose a top surface of the insulating pattern 226P.

A planar shape of each of the plurality of upper holes UH and the plurality of lower holes LH is not limited to a planar shape shown in FIGS. 7A and 7D and may be variously selected. After the first mold pattern 232P and the second mold pattern 234P are removed, sidewalls of the plurality of lower electrodes LE2 may be exposed.

In example embodiments, the second mold pattern 234P and the first mold pattern 232P may be wet etched/removed using an etchant including ammonium fluoride (NH$_4$F), hydrofluoric acid (HF), and water, without being limited thereto.

Figure 14F:
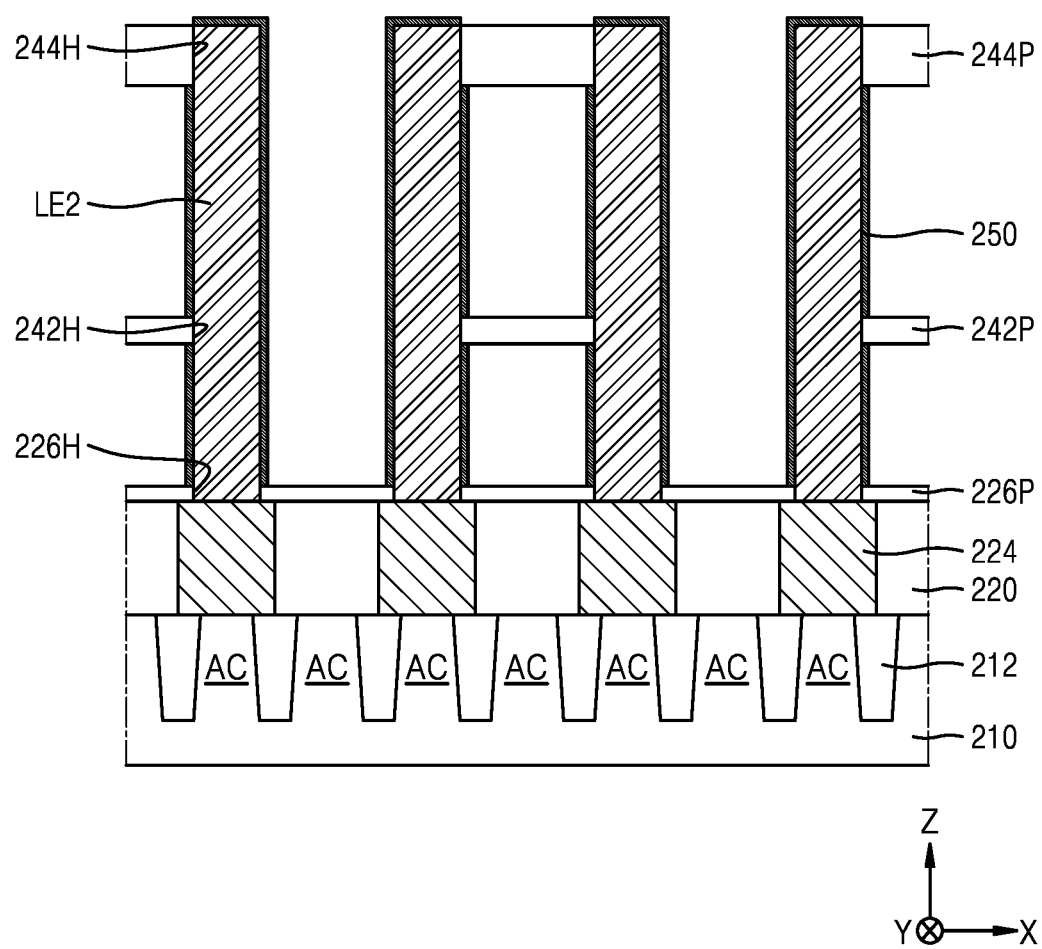

Referring to FIG. 14F, a conductive interface layer 250 may be selectively formed only on exposed surfaces of the plurality of lower electrodes LE2, from among exposed surfaces of the resultant structure of FIG. 14E.

In example embodiments, to form the conductive interface layer 250, at least one of the processes described with reference to FIGS. 11, 12, and 13A to 13D may be used. In example embodiments, the conductive interface layer 250 may have a thickness of about 1 Å to about 50 Å, without being limited thereto.

Figure 14G:
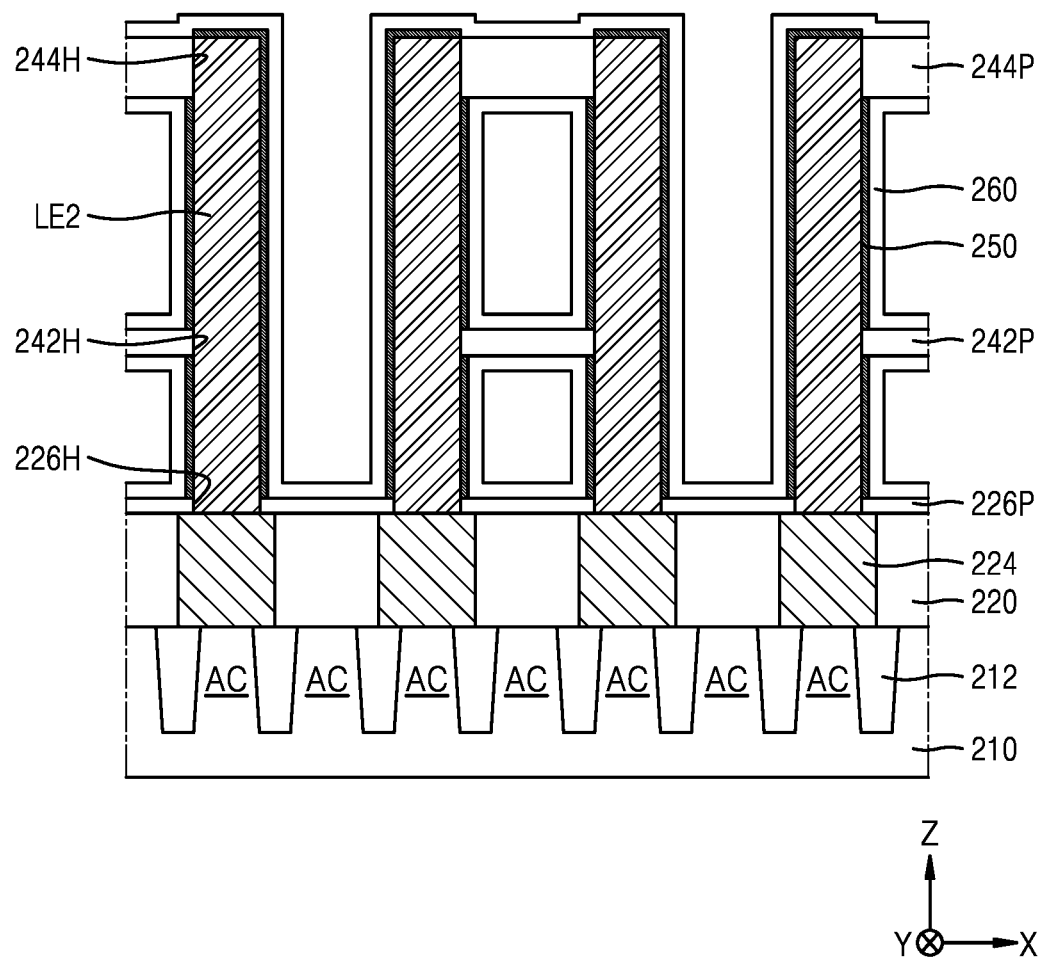

Referring to FIG. 14G, in the resultant structure of FIG. 14F, a dielectric film 260 may be formed on (e.g., to cover) exposed surfaces of the conductive interface layer 250, exposed surfaces of each of the lower insulating support pattern 242P and the upper insulating support pattern 244P, and exposed surfaces of the insulating pattern 226P.

The dielectric film 260 may be formed using an ALD process. The dielectric film 260 may include HfO$_2$, ZrO$_2$, Al$_2$O$_3$, La$_2$O$_3$, Ta$_2$O$_3$, Nb$_2$O$_5$, CeO$_2$, TiO$_2$, GeO$_2$, or a combination thereof, without being limited thereto.

Thereafter, an upper electrode UE2 may be formed on the resultant structure of FIG. 13G to cover the dielectric film 260. Thus, the IC devices 200, 200A, 200B, and 200C including any one of the capacitors CP2, CP2A, 2P2B, and CP2C shown in FIGS. 7A to 7D and 8A to 10 or IC devices having capacitors having various structures may be manufactured by making various modifications and changes within the scope of the inventive concept.

In example embodiments, the upper electrode UE2 may be formed using a CVD process, an MOCVD process, a physical vapor deposition (PVD) process, or an ALD process.

In the method of manufacturing an IC device, according to the embodiments described with reference to FIGS. 14A to 14G, when the conductive interface layers 250, 250A, 250B, and 250C are formed between the plurality of lower electrodes LE2 and the dielectric film 260, the conductive interface layers 250, 250A, 250B, and 250C may be selectively formed only on the surfaces of the plurality of lower electrodes LE2 by using an ASD process. To this end, before the conductive interface layers 250, 250A, 250B, and 250C are formed, a pre-processing process for selectively inhibiting deposition may be performed on surfaces on which the conductive interface layers 250, 250A, 250B, and 250C are not desired to be formed, and thus, a stabilization process for eliminating or minimizing chemical affinity with a precursor including a metal element may be performed. Accordingly, after the conductive interface layers 250, 250A, 250B, and 250C are formed, an additional etching process for removing unnecessary portions of the conductive interface layers 250, 250A, 250B, and 250C may be omitted. Thus, the possibility of undesired damage to the plurality of lower electrodes LE2 by the additional etching process may be removed, and a process of manufacturing the IC device may be simplified. Furthermore, a depletion layer may be inhibited (e.g., prevented) from being generated in portions of the plurality of lower electrodes LE2 that are adjacent to the dielectric film 260, the minimum capacitances of the capacitors CP2, CP2A, CP2B, and CP2C may be increased, leakage current may be inhibited from occurring, and the mass productivity and reliability of the IC device may be improved.

Next, example processes for forming conductive interface layers having various compositions according to embodiments will be described.

Formation Example 1

To selectively form a conductive interface layer only on a TiN film, from among a SiN film and the TiN film over a substrate on which the SiN film and the TiN film are exposed, a surface-processing material (e.g., a pre-processing gas) may be supplied for about 3 minutes onto the SiN film and the TiN film while heating the substrate to a temperature of about 300° C. Afterwards, a first process of supplying a triethyl aluminum (TEA, Al(C$_2$H$_5$)$_3$) precursor onto the substrate for about 10 seconds and performing a purge process for about 30 seconds may be performed. Thereafter, a second process of supplying an oxidizing gas for about 20 seconds and performing a purge process for about 30 seconds may be performed. An ASD process cycle including the first process and the second process may be repeated 250 times, and thus, a conductive interface layer including an aluminum oxide layer having a thickness of about 20 Å or less may be selectively formed only on the TiN film, from among the SiN film and the TiN film. The aluminum oxide layer may include aluminum oxide, such as Al$_2$O$_3$.

Formation Example 2

The same process as that in Formation example 1 may be performed except that a conductive interface layer including an aluminum oxide layer having a thickness of about 20 Å or less is selectively formed only on the TiN film, from among the SiN film and the TiN film, by using a trichloro aluminum (AlCl$_3$) precursor instead of a TEA precursor.

Formation Example 3

The same process as that in Formation example 1 may be performed except that a conductive interface layer including a NbOx layer having a thickness of about 20 Å or less is selectively formed only on the TiN film, from among the SiN film and the TiN film, by using a tert-butyliminotris (diethylamino)niobium (TBTDEN, tBuNNb(NEt$_2$)$_3$) precursor instead of a TEA precursor. The NbOx layer may include an allotrope (e.g., NbO, NbO$_2$, and Nb$_2$O$_5$) of niobium oxide.

Formation Example 4

The same process as that in Formation example 1 may be performed except that a conductive interface layer including a NbOx layer having a thickness of about 20 Å or less is selectively formed only on the TiN film, from among the SiN film and the TiN film, by using a tert-butyliminotris (dimethylamino)niobium (TBTDMN, tBuNNb(NMe$_2$)$_3$) precursor instead of a TEA precursor.

Formation Example 5

The same process as that in Formation example 1 may be performed except that a conductive interface layer including a TaOx layer having a thickness of about 20 Å or less is selectively formed only on the TiN film, from among the SiN film and the TiN film, by using a tert-butyliminotris (diethylamino)tantalum (TBTDET, tBuNTa(NEt$_2$)$_3$) precursor instead of a TEA precursor. The TaOx layer may include tantalum oxide, such as $Ta_2O_5$.

Formation Example 6

The same process as that in Formation example 1 may be performed except that a conductive interface layer including a TaOx layer having a thickness of about 20 Å or less is selectively formed only on the TiN film, from among the SiN film and the TiN film, by using a pentakis dimethyl-aminotantalum (TADMA, $Ta(NMe_2)_5$) precursor instead of a TEA precursor.

Formation Example 7

The same process as that in Formation example 1 may be performed except that a conductive interface layer including a TiOx layer having a thickness of about 20 Å or less is selectively formed only on the TiN film, from among the SiN film and the TiN film, by using a tetrakisdimethylami-notitanium (TDMAT, $Ti(NMe_2)_4$) precursor instead of a TEA precursor. The TiOx layer may include titanium oxide, such as TiO, $TiO_2$, $Ti_2O$, $Ti_2O$, $Ti_3O$, $Ti_3O_5$, and $Ti_4O_7$.

Formation Example 8

The same process as that in Formation example 1 may be performed except that a conductive interface layer including a TiOx layer having a thickness of about 20 Å or less is selectively formed only on the TiN film, from among the SiN film and the TiN film, by using a trimethoxy(pentam-ethylcyclopentadienyl)titanium ($(Cp^*)Ti(OMe)_3$) precursor as a TEA precursor.

Formation Example 9

The same process as that in Formation example 1 may be performed except that a conductive interface layer including a TiOx layer having a thickness of about 20 Å or less is selectively formed only on the TiN film, from among the SiN film and the TiN film, by using a $TiCl_4$ precursor instead of a TEA precursor.

Formation Example 10

The same process as that in Formation example 1 may be performed, and thus, a first interface sub-layer including an AlOx layer may be selectively formed only on the TiN film, from among the SiN film and the TiN film.

Thereafter, a third process of supplying a TDMAT precursor for about 10 seconds and performing a purge process for about 30 seconds may be performed. Afterwards, a fourth process of supplying an oxidizing gas for about 20 seconds and performing a purge process for about 30 seconds may be performed. An ASD process cycle including the third process and the fourth process may be repeated 250 times, and thus, a second interface sub-layer including a TiOx layer having a thickness of about 20 Å or less may be selectively formed only on the first interface sub-layer, from among the SiN film and the first interface sub-layer. As a result, a conductive interface layer including a double film of an AlOx layer and a TiOx layer may be selectively formed only on the TiN film, from among the SiN film and the TiN film.

Formation Example 11

A process similar to that in Formation example 10 may be performed except that a TiOx layer is first formed and an AlOx layer is formed on the TiOx layer. Thus, a conductive interface layer including a double film of the TiOx layer and the AlOx layer may be selectively formed only on the TiN film, from among the SiN film and the TiN film.

Formation Example 12

The same process as that in Formation example 3 may be performed, and thus, a first interface sub-layer including a NbOx layer may be selectively formed only on the TiN film, from among the SiN film and the TiN film.

Thereafter, a third process of supplying a TDMAT precursor for about 10 seconds and performing a purge process for about 30 seconds may be performed. Afterwards, a fourth process of supplying an oxidizing gas for about 20 seconds and performing a purge process for about 30 seconds may be performed. An ASD process cycle including the third process and the fourth process may be repeated 250 times, and thus, a second interface sub-layer including a TiOx layer having a thickness of about 20 Å or less may be selectively formed only on the first interface sub-layer, from among the SiN film and the first interface sub-layer. As a result, a conductive interface layer including a double film of an NbOx layer and a TiOx layer may be selectively formed only on the TiN film, from among the SiN film and the TiN film.

Formation Example 13

A process similar to that in Formation example 12 may be performed except that a TiOx layer is first formed and a NbOx layer is formed on the TiOx layer. Thus, a conductive interface layer including a double film of a TiOx layer and a NbOx layer may be selectively formed only on the TiN film, from among the SiN film and the TiN film.

Formation Example 14

The same process as that in Formation example 7 may be performed, and thus, a first interface sub-layer including a TiOx layer may be formed. Thereafter, a third process of supplying a TBTDET precursor for about 10 seconds and performing a purge process for about 30 seconds may be performed. Afterwards, a fourth process of supplying an oxidizing gas for about 20 seconds and performing a purge process for about 30 seconds may be performed. An ASD process cycle including the third process and the fourth process may be repeated 250 times, and thus, a second interface sub-layer including a TaOx layer having a thickness of about 20 Å or less may be selectively formed only on the first interface sub-layer, from among the SiN film and the first interface sub-layer. As a result, a conductive interface layer including a double film of a TiOx layer and a TaOx layer may be selectively formed only on the TiN film, from among the SiN film and the TiN film.

Formation Example 15

A process similar to that in Formation example 14 may be performed except that a TaOx layer is first formed and a TiOx layer is formed on the TaOx layer. Thus, a conductive interface layer including a double film of a TaOx layer and a TiOx layer may be selectively formed only on the TiN film, from among the SiN film and the TiN film.

Formation Example 16

The same process as that in Formation example 10 may be performed, and thus, a first interface sub-layer including a TiOx layer and a second interface sub-layer including an AlOx layer may be selectively formed only on the TiN film, from among the SiN film and the TiN film.

Thereafter, a fifth process of supplying a TDMAT precursor for about 10 seconds and performing a purge process for about 30 seconds may be performed. Afterwards, a sixth process of supplying an oxidizing gas for about 20 seconds and performing a purge process for about 30 seconds may be performed. An ASD process cycle including the fifth process and the sixth process may be repeated 250 times, and thus, a third interface sub-layer including a TiOx layer having a thickness of about 20 Å or less may be selectively formed only on the second interface sub-layer, from among the SiN film and the second interface sub-layer. As a result, a conductive interface layer including a triple film in which a TiOx layer, an AlOx layer, and a TiOx layer are sequentially stacked may be selectively formed only on the TiN film, from among the SiN film and the TiN film.

Formation Example 17

A process similar to that in Formation example 16 may be performed except that a first interface sub-layer including an AlOx layer is first formed, and a second interface sub-layer including a TiOx layer and a third interface sub-layer including an AlOx layer are sequentially formed on the first interface sub-layer. As a result, a conductive interface layer including a triple layer in which an AlOx layer, a TiOx layer, and an AlOx layer are sequentially stacked may be selectively formed only on the TiN film, from among the SiN film and the TiN film.

Formation Example 18

The same process as that in Formation example 13 may be performed, and thus, a first interface sub-layer including a TiOx layer and a second interface sub-layer including a NbOx layer may be selectively formed only on the TiN film, from among the SiN film and the TiN film.

Thereafter, a fifth process of supplying a TDMAT precursor for about 10 seconds and performing a purge process for about 30 seconds may be performed. Afterwards, a sixth process of supplying an oxidizing gas for about 20 seconds and performing a purge process for about 30 seconds may be performed. An ASD process cycle including the fifth process and the sixth process may be repeated 250 times, and thus, a third interface sub-layer including a TiOx layer having a thickness of about 20 Å or less may be selectively formed only on the second interface sub-layer, from among the SiN film and the second interface sub-layer. As a result, a conductive interface layer including a triple layer in which a TiOx layer, a NbOx layer, and a TiOx layer are sequentially stacked may be selectively formed only on the TiN film, from among the SiN film and the TiN film.

Formation Example 19

A process similar to that in Formation example 18 may be performed except that a first interface sub-layer including a NbOx layer is first formed, and a second interface sub-layer including a TiOx layer and a third interface sub-layer including a NbOx layer are sequentially formed on the first interface sub-layer. As a result, a conductive interface layer including a triple layer in which a NbOx layer, a TiOx layer, and a NbOx layer are sequentially stacked may be selectively formed only on the TiN film, from among the SiN film and the TiN film.

Formation Example 20

The same process as that in Formation example 14 may be performed, and thus, a first interface sub-layer including a TiOx layer and a second interface sub-layer including a TaOx layer may be selectively formed only on the TiN film, from among the SiN film and the TiN film.

Thereafter, an ASD process cycle including the fifth process and the sixth process, which have been described in Formation example 18, may be repeated 250 times, and thus, a third interface sub-layer including a TiOx layer having a thickness of about 20 Å or less may be selectively formed only on the second interface sub-layer, from among the SiN film and the second interface sub-layer. As a result, a conductive interface layer including a triple layer in which a TiOx layer, a TaOx layer, and a TiOx layer are sequentially stacked may be selectively formed only on the TiN film, from among the SiN film and the TiN film.

Formation Example 21

A process similar to that in Formation example 20 may be performed except that a first interface sub-layer including a TaOx layer is first formed, and a second interface sub-layer including a TiOx layer and a third interface sub-layer including a TaOx layer are sequentially formed on the first interface sub-layer. As a result, a conductive interface layer including a triple film in which a TaOx layer, a TiOx layer, and a TaOx layer are sequentially stacked may be selectively formed only on the TiN film, from among the SiN film and the TiN film.

While the inventive concept has been particularly shown and described with reference to embodiments thereof, it will be understood that various changes in form and details may be made therein without departing from the scope of the following claims.

What is claimed is:

1. An integrated circuit device comprising:
    a lower electrode on a substrate, the lower electrode comprising a first metal;
    an insulating pattern adjacent to the lower electrode
    a dielectric film on a sidewall of the lower electrode, the dielectric film comprising a lower surface in contact with the insulating pattern;
    a conductive interface layer between the sidewall of the lower electrode and the dielectric film, the conductive interface layer comprising a metal oxide film including at least one metal element; and
    an upper electrode opposite the lower electrode, with the conductive interface layer and the dielectric film therebetween,
    wherein a sidewall of the dielectric film that faces the lower electrode is spaced apart from the lower electrode with the conductive interface layer therebetween, and
    wherein the conductive interface layer is not between the insulating pattern and the dielectric film.

2. The integrated circuit device of claim 1,
    wherein the conductive interface layer comprises a first interface sub-layer and a second interface sub-layer,
    wherein the first interface sub-layer is between the second interface sub-layer and the lower electrode, and
    wherein the first interface sub-layer and the second interface sub-layer comprise respective metal oxide films comprising different metal elements, respectively.

3. The integrated circuit device of claim 1, wherein the at least one metal element included in the conductive interface layer comprises an alkali metal, an alkaline earth metal, a transition metal, or a post-transition metal.

4. The integrated circuit device of claim 1, wherein a thickness of the conductive interface layer is less than a thickness of the dielectric film.

5. The integrated circuit device of claim 1,
wherein the conductive interface layer comprises a first interface sub-layer, a second interface sub-layer, and a third interface sub-layer,
wherein the first interface sub-layer is between the second interface sub-layer and the lower electrode,
wherein the second interface sub-layer is between the first interface sub-layer and the third interface sub-layer, and
wherein the first interface sub-layer, the second interface sub-layer, and the third interface sub-layer comprise respective metal oxide films comprising different metal elements, respectively.

6. The integrated circuit device of claim 1,
wherein the conductive interface layer comprises a first interface sub-layer, a second interface sub-layer, and a third interface sub-layer,
wherein the first interface sub-layer is between the second interface sub-layer and the lower electrode,
wherein the second interface sub-layer is between the first interface sub-layer and the third interface sub-layer,
wherein each of the first interface sub-layer and the third interface sub-layer comprises a first metal element, and
wherein the second interface sub-layer comprises a second metal element that is different from the first metal element.

7. The integrated circuit device of claim 1, wherein the metal oxide film comprises a single film comprising at least two different metal elements.

8. The integrated circuit device of claim 1, wherein the conductive interface layer has a structure in which a first interface sub-layer and a second interface sub-layer are alternately stacked one by one, wherein the first interface sub-layer comprises a first metal oxide film comprising a first metal element, the second interface sub-layer comprises a second metal oxide film comprising a second metal element, and the second metal element is different from the first metal element.

9. The integrated circuit device of claim 1,
wherein an uppermost surface of the lower electrode extends in a lateral direction without a step,
wherein the conductive interface layer comprises an interface top portion and an interface side portion, wherein the interface top portion is in contact with the uppermost surface of the lower electrode and extends in the lateral direction without a step, and the interface side portion is integrally connected to the interface top portion and in contact with the sidewall of the lower electrode, and
wherein a width of the interface top portion is greater than a width of the uppermost surface of the lower electrode in the lateral direction.

10. An integrated circuit device comprising:
a substrate comprising an active region;
a conductive region on the active region;
a capacitor on the conductive region; and
an insulating support pattern configured to support a portion of the capacitor,
wherein the capacitor comprises:
a lower electrode comprising a first metal, the lower electrode comprising a sidewall having a first portion in contact with the insulating support pattern and a second portion not in contact with the insulating support pattern;
a dielectric film on the lower electrode and the insulating support pattern;
an interface layer between the lower electrode and the dielectric film, the interface layer comprising a metal oxide film including at least one metal element; and
an upper electrode opposite the lower electrode, with the interface layer and the dielectric film therebetween, the upper electrode comprising a second metal,
wherein the interface layer comprises at least three interface sub-layers that are on the lower electrode, and
wherein two adjacent ones of the at least three interface sub-layers comprise different metal elements, respectively.

11. The integrated circuit device of claim 10,
wherein the interface layer comprises a plurality of interface sub-layers that are on the lower electrode,
wherein the plurality of interface sub-layers comprise a first interface sub-layer and a second interface sub-layer that are in contact with each other,
wherein the first interface sub-layer is between the second interface sub-layer and the lower electrode, and
wherein the first interface sub-layer and the second interface sub-layer comprise different metal elements, respectively.

12. The integrated circuit device of claim 10, wherein the insulating support pattern comprises a silicon nitride (SiN) film, a silicon carbon nitride (SiCN) film, a silicon boron nitride (SiBN) film, or a combination thereof.

13. The integrated circuit device of claim 10, wherein the interface layer comprises aluminum (Al), zirconium (Zr), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), bismuth (Bi), or a combination thereof.

14. The integrated circuit device of claim 10,
wherein a first vertical distance from the substrate to an uppermost surface of the interface layer is greater than a second vertical distance from the substrate to an uppermost surface of the insulating support pattern,
wherein the second portion of the sidewall of the lower electrode is larger than the first portion of the sidewall of the lower electrode, and
wherein a lower surface of the lower electrode is in contact with an upper surface of the conductive region.

15. The integrated circuit device of claim 10,
wherein an uppermost surface of the lower electrode extends in a lateral direction without a step,
wherein the interface layer comprises an interface top portion and an interface side portion, wherein the interface top portion is in contact with the uppermost surface of the lower electrode and extends in the lateral direction without a step, and the interface side portion is integrally connected to the interface top portion and in contact with the second portion of the sidewall of the lower electrode, and
wherein a width of the interface top portion is greater than a width of the uppermost surface of the lower electrode in the lateral direction.

16. An integrated circuit device comprising:
a substrate comprising an active region;
a plurality of conductive regions on the active region;

an insulating pattern extending in a lateral direction on the plurality of conductive regions, the insulating pattern having a plurality of openings vertically overlapping the plurality of conductive regions;

a plurality of lower electrodes passing through the insulating pattern via the plurality of openings, the plurality of lower electrodes being connected to the plurality of conductive regions and each comprising a first metal;

an insulating support pattern extending in the lateral direction at a position spaced apart from the insulating pattern in a vertical direction, the insulating support pattern in contact with a portion of each of the plurality of lower electrodes to support the plurality of lower electrodes;

a dielectric film on the plurality of lower electrodes, the insulating pattern, and the insulating support pattern;

a conductive interface layer between the plurality of lower electrodes and the dielectric film, the conductive interface layer comprising a metal oxide film including at least one metal element; and an upper electrode opposite the plurality of lower electrodes, with the conductive interface layer and the dielectric film therebetween, the upper electrode comprising a second metal.

17. The integrated circuit device of claim 16, wherein the conductive interface layer comprises a plurality of interface sub-layers that are on a surface of each of the plurality of lower electrodes, and wherein the plurality of interface sub-layers comprise a first interface sub-layer and a second interface sub-layer that are in contact with each other, wherein the first interface sub-layer is between the second interface sub-layer and the surface, and wherein the first interface sub-layer and the second interface sub-layer comprise different metal elements, respectively.

18. The integrated circuit device of claim 16, wherein the conductive interface layer comprises two or more of aluminum oxide, zirconium oxide, niobium oxide, molybdenum oxide, ruthenium oxide, indium oxide, tin oxide, antimony oxide, scandium oxide, titanium oxide, vanadium oxide, manganese oxide, iron oxide, cobalt oxide, nickel oxide, arsenic oxide, tantalum oxide, tungsten oxide, iridium oxide, yttrium oxide, or bismuth oxide.

* * * * *